US011195852B2

(12) United States Patent
Oh et al.

(10) Patent No.: US 11,195,852 B2
(45) Date of Patent: Dec. 7, 2021

(54) SEMICONDUCTOR MEMORY DEVICE HAVING WIRING LINE STRUCTURE

(71) Applicant: SK hynix Inc., Gyeonggi-do (KR)

(72) Inventors: Sung Lae Oh, Chungcheongbuk-do (KR); Jin Ho Kim, Gyeonggi-do (KR); Sang Hyun Sung, Chungcheongbuk-do (KR); Young Ki Kim, Gyeonggi-do (KR); Byung Hyun Jeon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 255 days.

(21) Appl. No.: 16/685,278

(22) Filed: Nov. 15, 2019

(65) Prior Publication Data

US 2020/0312830 A1    Oct. 1, 2020

(30) Foreign Application Priority Data

Mar. 28, 2019 (KR) .................. 10-2019-0035753

(51) Int. Cl.
*H01L 27/11582* (2017.01)
*H01L 25/18* (2006.01)
(Continued)

(52) U.S. Cl.
CPC ...... *H01L 27/11582* (2013.01); *H01L 23/528* (2013.01); *H01L 23/5226* (2013.01);
(Continued)

(58) Field of Classification Search
CPC ............... H01L 27/11582; H01L 25/18; H01L 27/1157; H01L 2924/14511; H01L 2224/08145; H01L 2924/1431; H01L 27/0688; H01L 27/11575; H01L 27/11573; H01L 23/5226; H01L 23/528; H01L 27/11524; H01L 27/11529; H01L 27/11521; H01L 27/11526; H01L 29/42324–42336; H01L 29/788–7889
See application file for complete search history.

(56) References Cited

U.S. PATENT DOCUMENTS

2020/0161326 A1* 5/2020 Oh .................... H01L 21/31144

FOREIGN PATENT DOCUMENTS

KR    10-2016-0096309    8/2016
KR    10-2017-0126772    11/2017

* cited by examiner

*Primary Examiner* — Thanh Y. Tran
(74) *Attorney, Agent, or Firm* — IP & T Group LLP

(57) ABSTRACT

A semiconductor memory device includes a substrate having a second region extending in a first direction; a memory block including electrodes; a slit dividing the memory block into first and second electrode structures in the second region; and step-shaped grooves formed in the memory block in the second region, and divided by the slit. In the second region, the first and second electrode structures are adjacently disposed with the slit interposed therebetween, in a second direction intersecting with the first direction. Each of the electrodes of the first electrode structure has a first pad region, each of the electrodes of the second electrode structure has a second pad region, and first and second pad regions of the first and second electrode structures which are positioned in the same step-shaped groove and are disposed at the same layers are adjacently disposed in the second direction with the slit interposed therebetween.

20 Claims, 37 Drawing Sheets

(51) Int. Cl.
    *H01L 23/522*      (2006.01)
    *H01L 23/528*      (2006.01)
    *H01L 27/11573*    (2017.01)
    *H01L 23/00*       (2006.01)
    *H01L 27/11575*    (2017.01)
    *H01L 27/11565*    (2017.01)
    *H01L 27/1157*     (2017.01)
(52) U.S. Cl.
    CPC .............. *H01L 24/08* (2013.01); *H01L 25/18* (2013.01); *H01L 27/11565* (2013.01); *H01L 27/11573* (2013.01); *H01L 27/11575* (2013.01); *H01L 27/1157* (2013.01); *H01L 2224/08145* (2013.01); *H01L 2924/1431* (2013.01); *H01L 2924/14511* (2013.01)

FIG.9
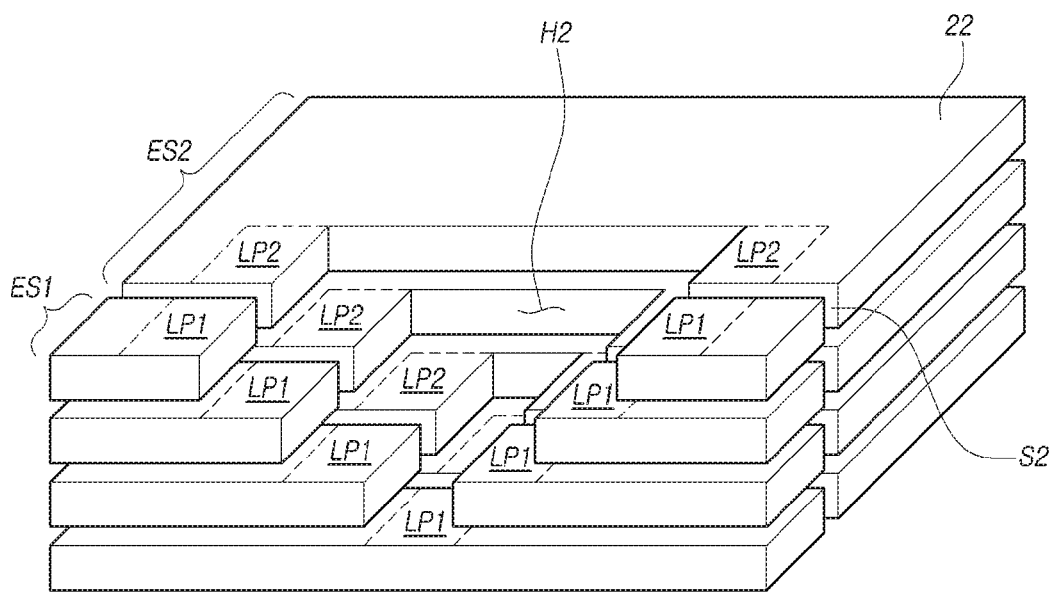
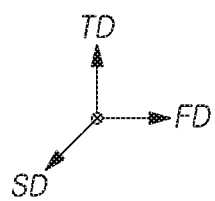

FIG.14
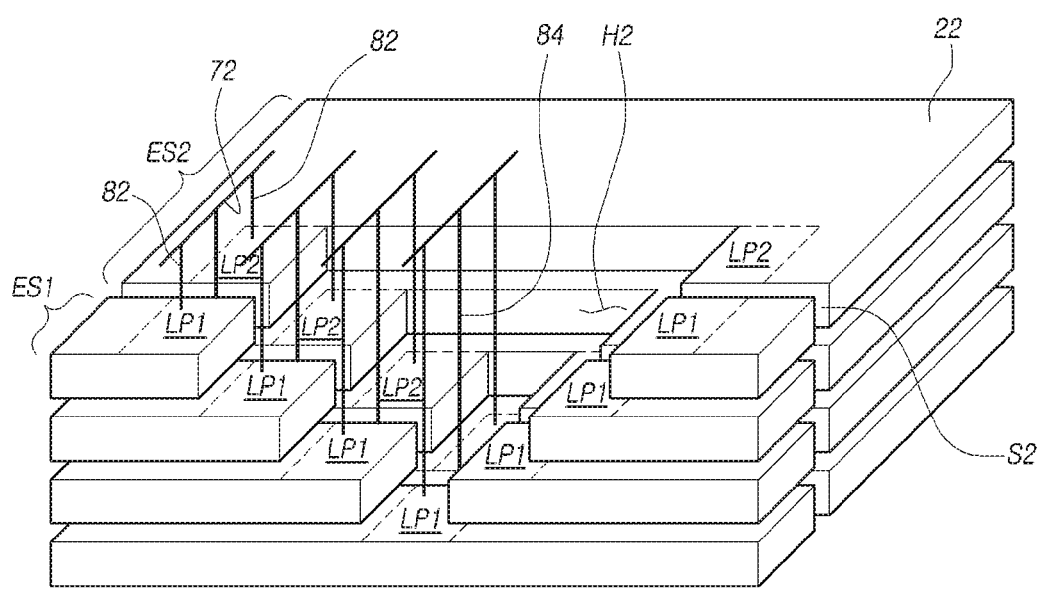
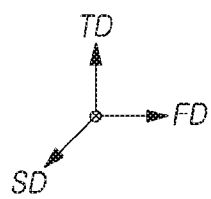

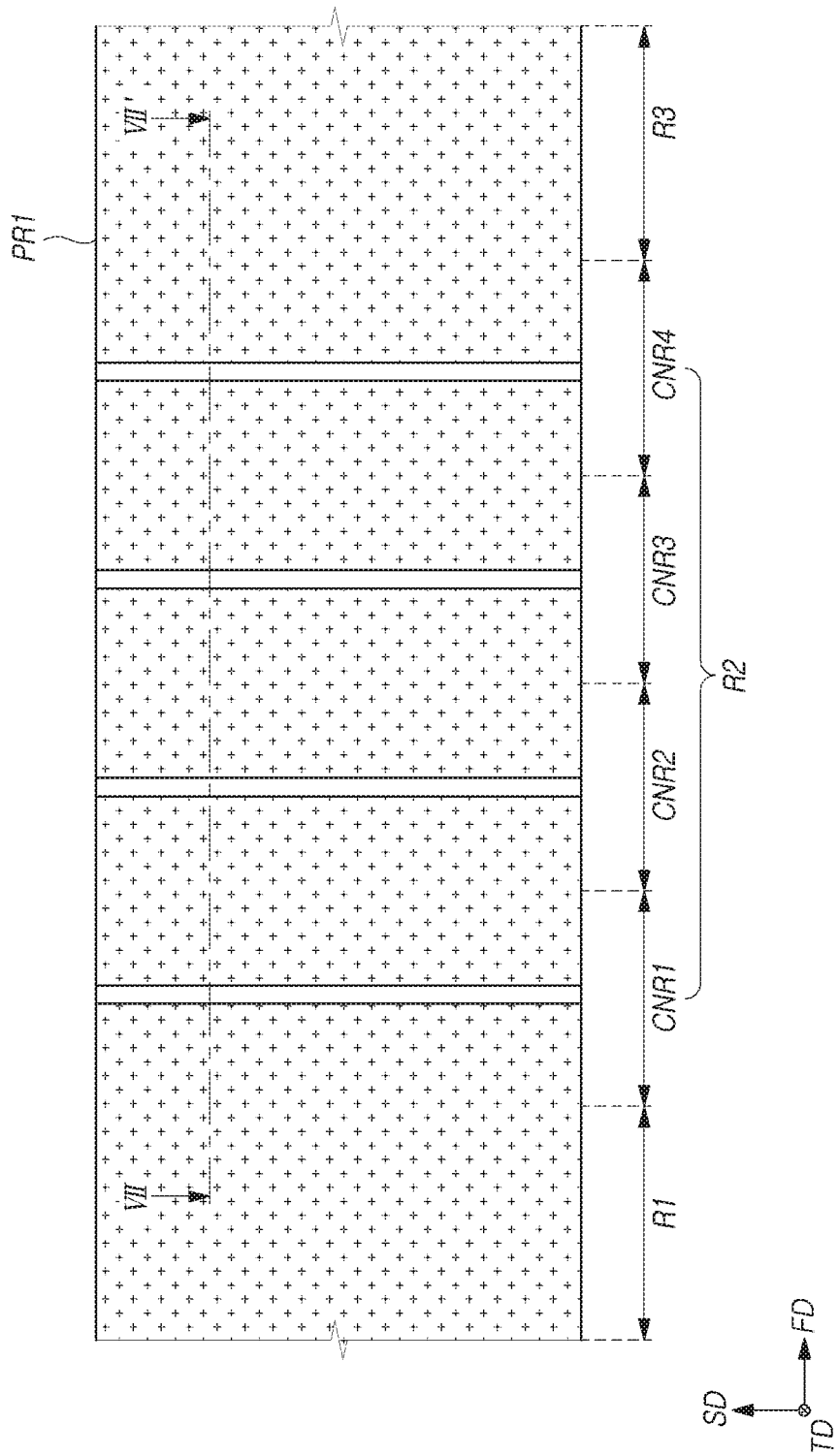

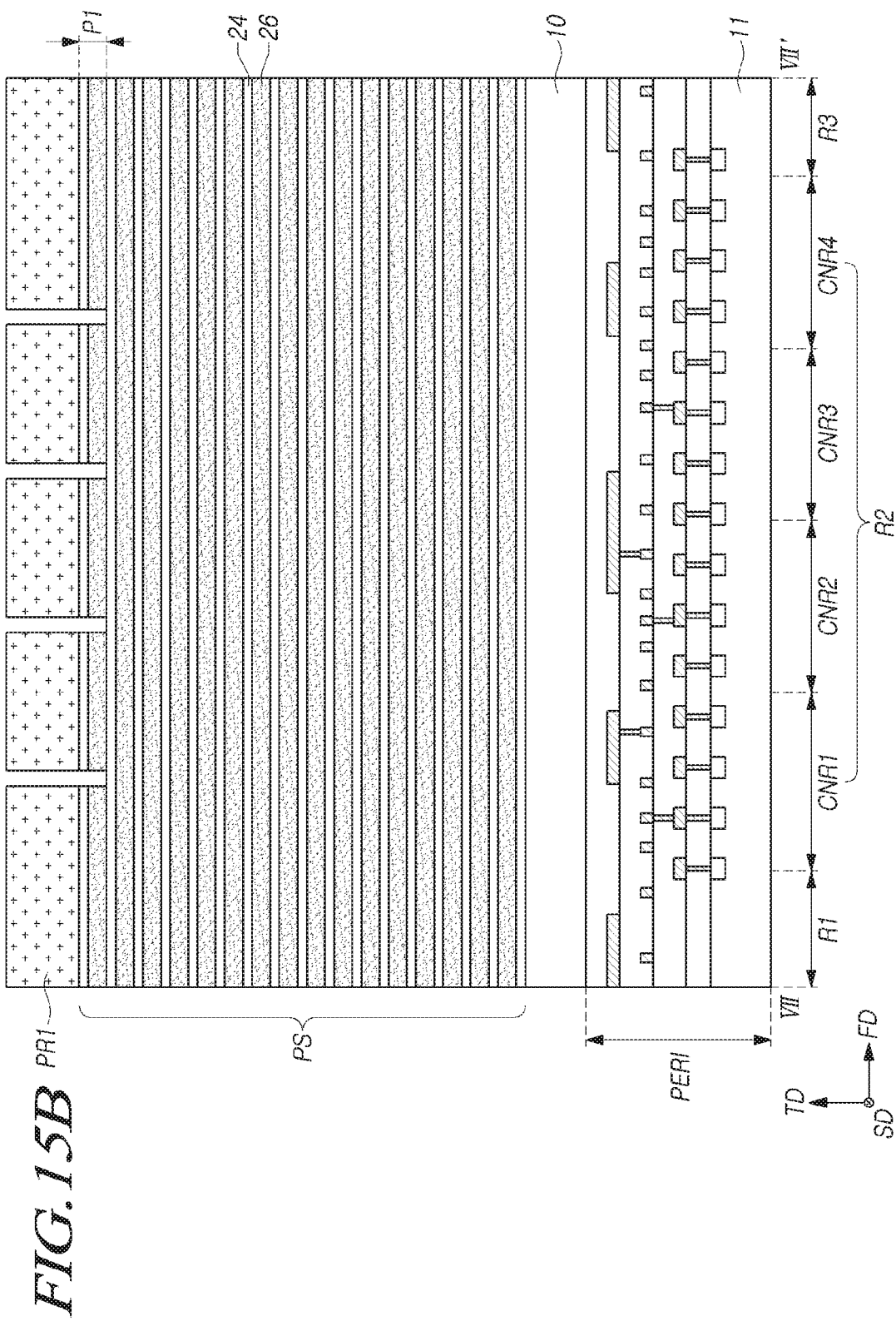

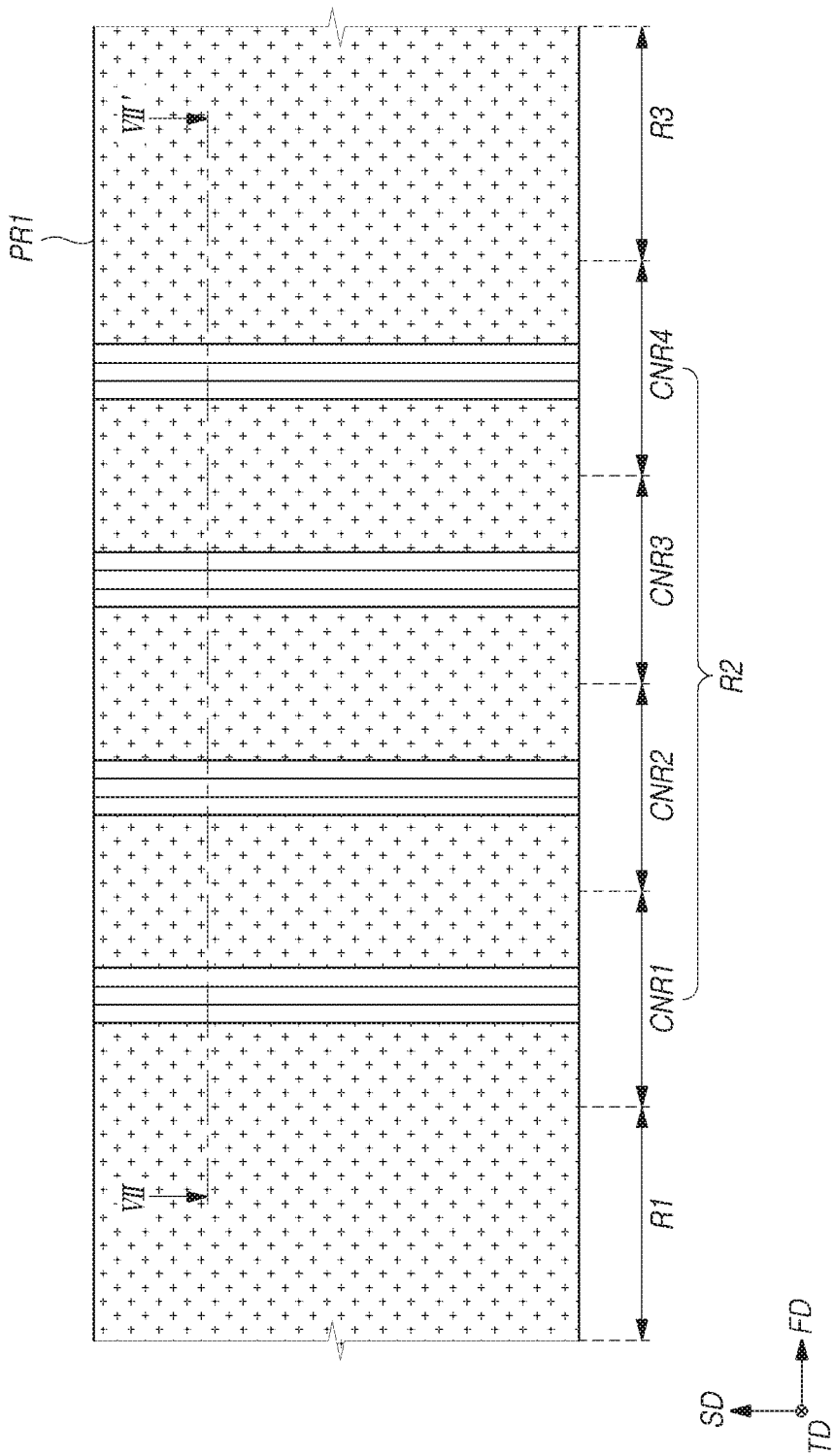

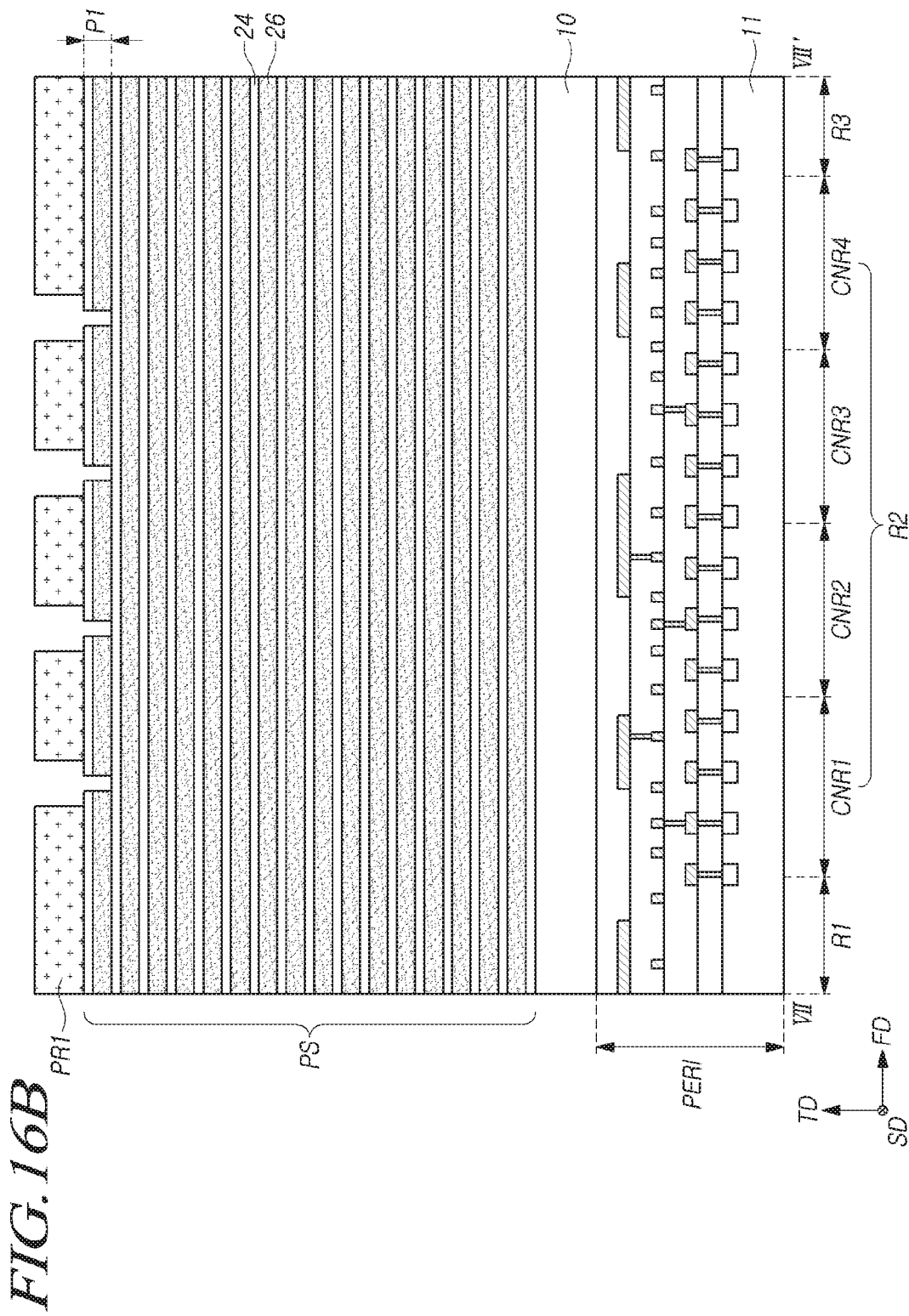

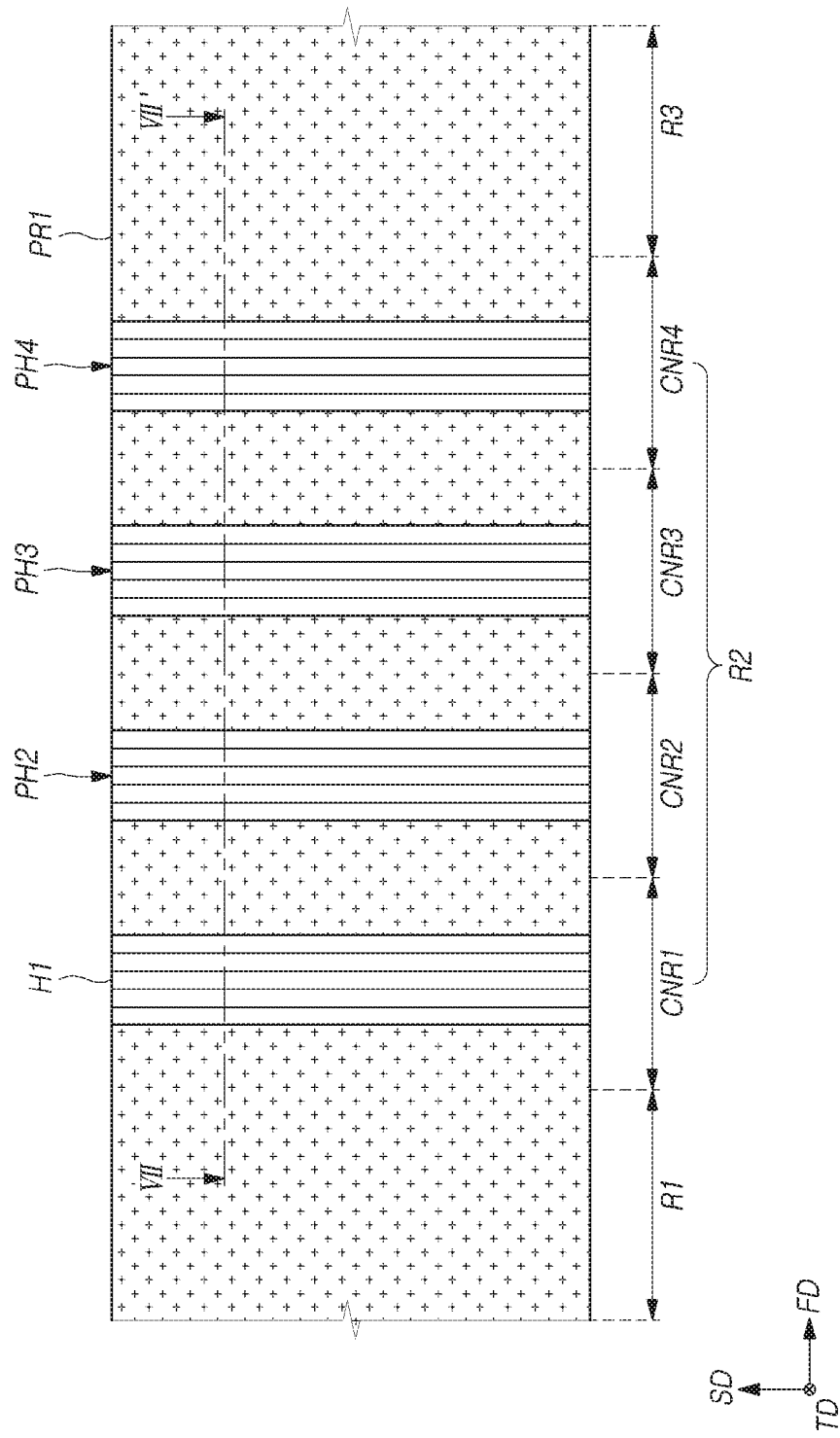

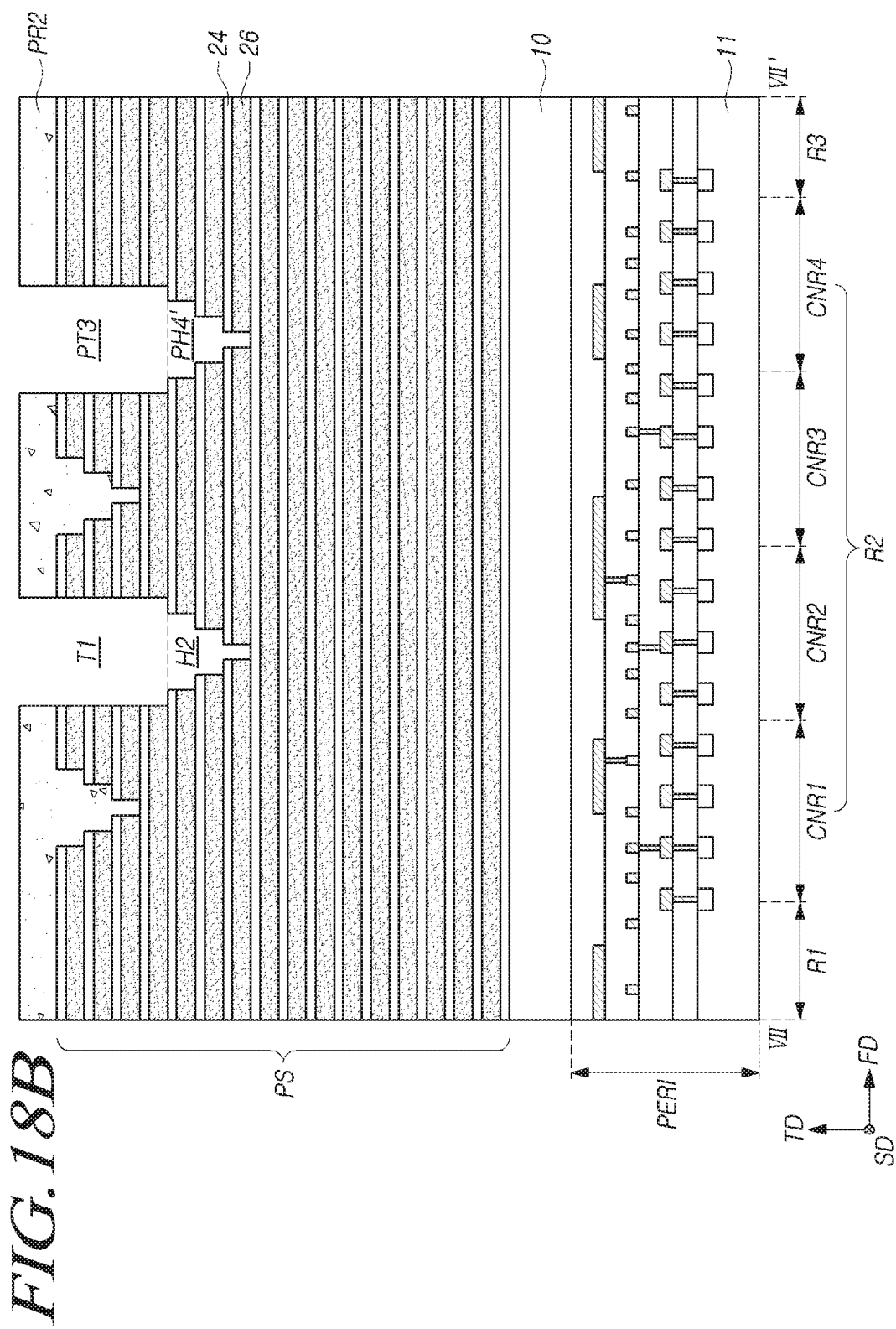

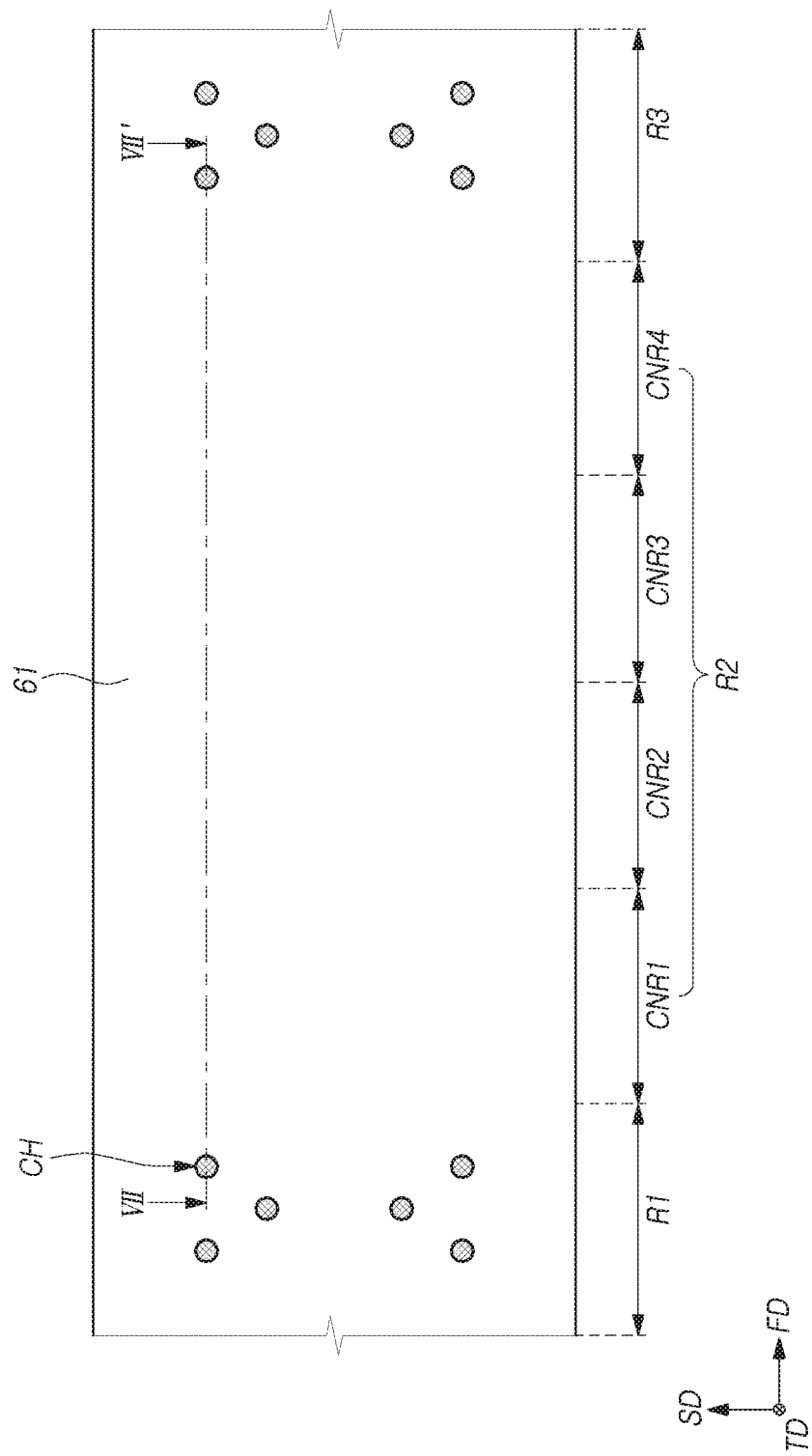

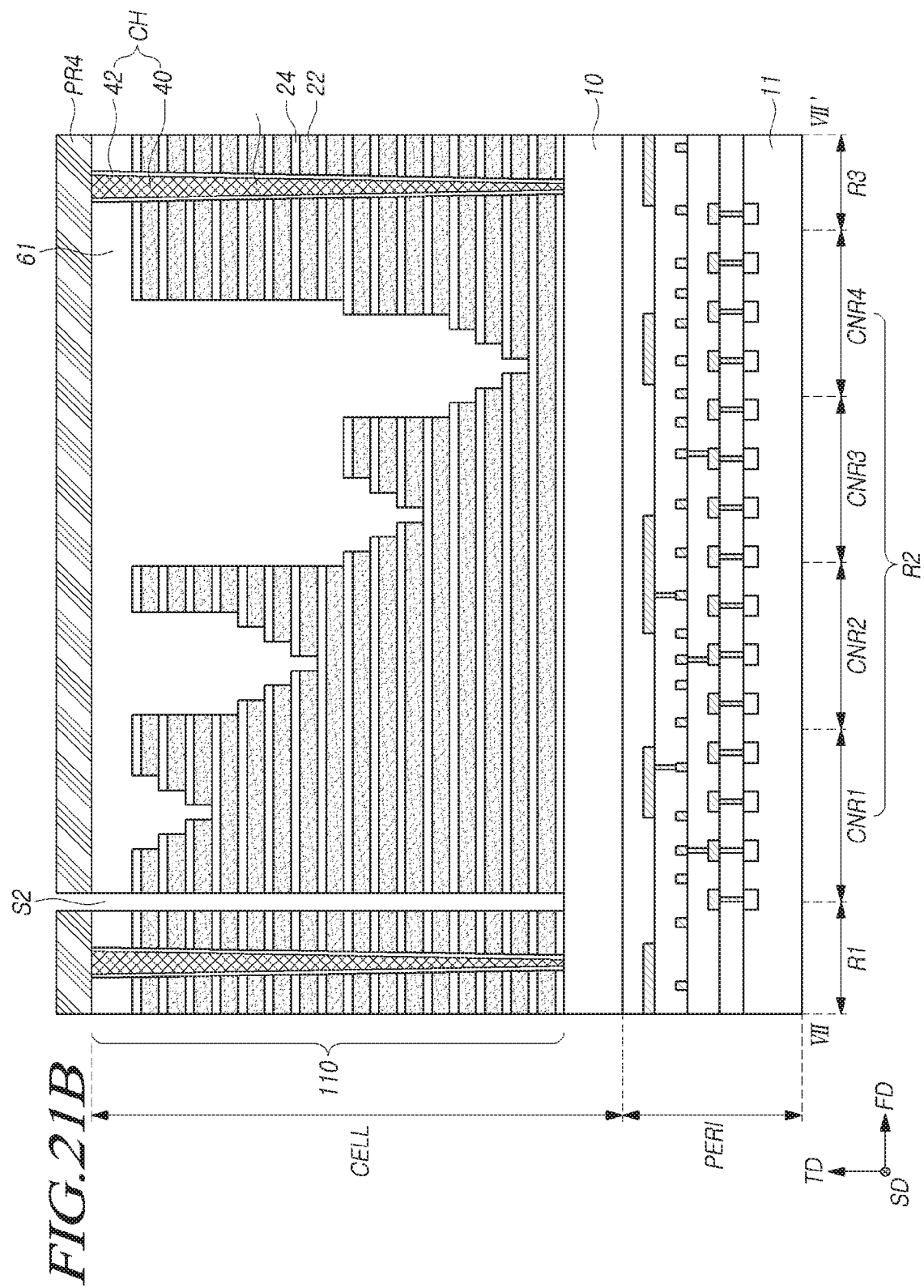

SEMICONDUCTOR MEMORY DEVICE HAVING WIRING LINE STRUCTURE

CROSS-REFERENCE TO RELATED APPLICATION

The present application claims priority to Korean Patent Application No. 10-2019-0035753 filed on Mar. 28, 2019, in the Korean Intellectual Property Office, which is incorporated herein by reference in its entirety.

BACKGROUND

1. Technical Field

Various embodiments of the present invention generally relate to a semiconductor memory device of a three-dimensional structure and, more particularly, to a semiconductor memory device of a three-dimensional structure having an improved wiring line structure.

2. Related Art

Generally, as semiconductor memory devices trend toward larger capacity and higher degree of integration, the number of the required wiring lines included in the semiconductor memory device for the operation and electrical coupling of the semiconductor memory device increases. Also, the structure of the wiring lines becomes more complex. At the same time, the area allocated for the layout of the wiring lines is decreasing. Therefore, simplifying the structure of the wiring lines which are employed in a semiconductor memory device and reducing an area occupied by the wiring lines would be highly desirable.

SUMMARY

The present invention in its broadest aspects relates to a semiconductor memory device of a three-dimensional structure having an improved wiring line structure. One advantage of the improved wiring line structure is that it reduces the area required by the wiring structure, thus allowing more area of the semiconductor device to be used for storing data. In an embodiment, a semiconductor memory device may include: a first substrate including first, second, and third regions arranged adjacent sequentially adjacent to each other along a first direction; a memory block including a plurality of electrodes and interlayer dielectric layers alternately stacked over the first substrate; a slit dividing the memory block into a first electrode structure and a second electrode structure in the second region; and a plurality of step-shaped grooves formed to different depths in the memory block in the second region, the plurality of the step-shaped grooves being divided by the slit. The first electrode structure and the second electrode structure may be disposed adjacent to each other in a second direction intersecting with the first direction with the slit interposed therebetween. Each of the electrodes of the first electrode structure may have a first pad region which is exposed by another electrode positioned thereon, in any one of the step-shaped grooves, each of the electrodes of the second electrode structure may have a second pad region which is exposed by another electrode positioned thereon, in any one of the step-shaped grooves, and first pad regions of the first electrode structure and second pad regions of the second electrode structure which are positioned in the same step-shaped groove and are disposed at the same layers may be disposed adjacent to each other in the second direction with the slit interposed therebetween.

The semiconductor memory device may further include a plurality of wiring lines which are coupled in common to first pad regions and second pad regions which are disposed at upper positions in the memory block and are disposed at the same layers. The wiring lines may be disposed within a width of the memory block in the second direction.

In an embodiment, a semiconductor memory device may include: a first substrate defined with a first region, a second region which extends from the first region in a first direction, and a third region which extends from the second region in the first direction; first and second memory blocks each including a plurality of electrodes and a plurality of interlayer dielectric layers which are alternately stacked over the first substrate, and disposed adjacent to each other in a second direction intersecting with the first direction with a first slit interposed therebetween; a second slit dividing each of the first and second memory blocks into a first electrode structure and a second electrode structure; and a plurality of step-shaped grooves formed to different depths in the first and second memory blocks in the second region, and divided by the first slit and the second slit. In the second region, the first electrode structure and the second electrode structure may be disposed adjacent to each other in the second direction with the second slit interposed therebetween. Each of the electrodes of the first electrode structure may have a first pad region which is exposed by another electrode positioned thereon, in any one of the step-shaped grooves, and each of the electrodes of the second electrode structure may have a second pad region which is exposed by another electrode positioned thereon, in any one of the step-shaped grooves. First pad regions of the first electrode structure and second pad regions of the second electrode structure which are positioned in the same step-shaped groove and are disposed at the same layers may be disposed adjacent to each other in the second direction with the second slit interposed therebetween.

In an embodiment, a semiconductor memory device may include: a first substrate including at least one contact region disposed between a first region, and a third region arranged in a first direction; first and second electrode structures disposed over the first substrate adjacent to each other in a second direction intersecting with the first direction with a slit separating the first and second electrode structures. The first and third regions are memory cell regions including a plurality of memory cells. The at least one contact region includes a plurality of step-shaped grooves formed to different depths and divided by the slit.

These and other advantages and features of the present invention will become better understood by those with ordinary skill in this art from the following detailed description of preferred embodiments in conjunction with the following drawings.

BRIEF DESCRIPTION OF THE DRAWINGS

FIG. 9 is a perspective view schematically illustrating a part of a region where a second step-shaped groove is formed in FIG. 5B.

FIG. 14 is a perspective view schematically illustrating a part of a region where the second step-shaped groove is formed in FIG. 10.

FIGS. 15A to 21A are top views illustrating the semiconductor memory device according to a manufacturing sequence according to an embodiment of the present invention.

FIGS. 15B to 21B are cross-sectional views taken along the lines VII-VII' of FIGS. 15A to 21A.

DETAILED DESCRIPTION

Figure 1:
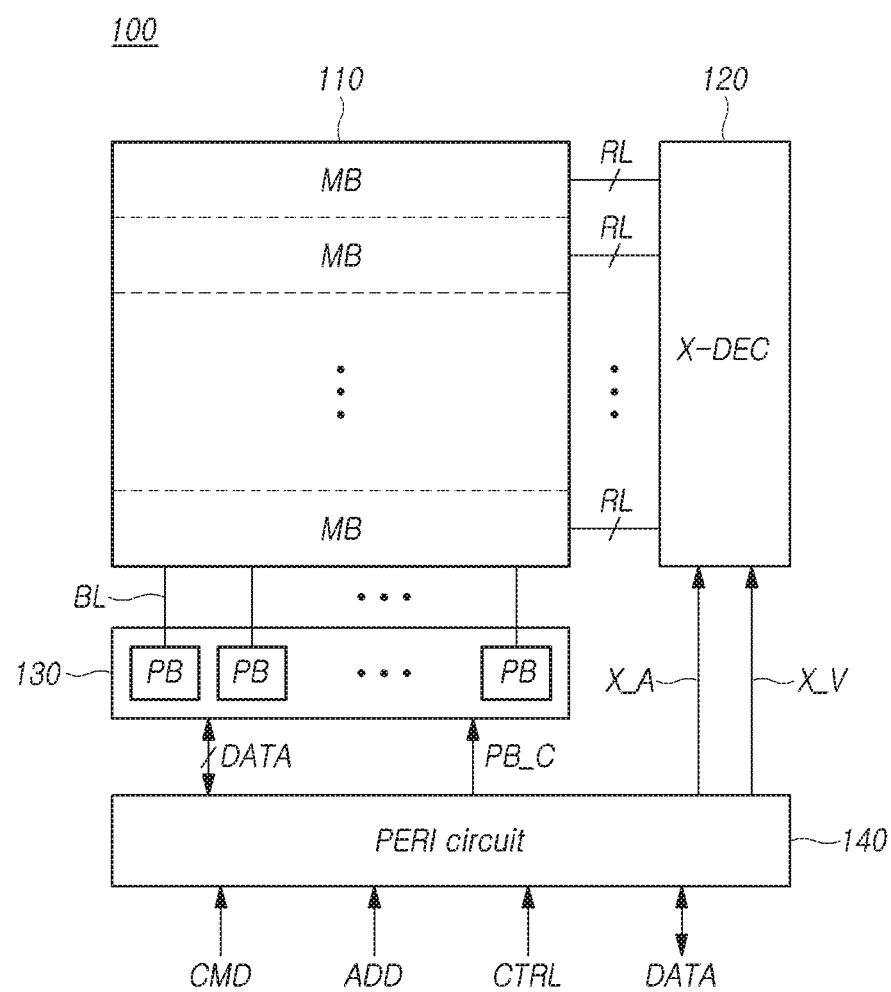
FIG. 1 is a block diagram schematically illustrating a configuration of a semiconductor memory device in accordance with an embodiment of the present invention.

Advantages and features of the present invention will become apparent from the following descriptions of various embodiments with reference to the accompanying drawings. However, the disclosure is not limited to the embodiments disclosed herein but may be implemented in various different ways. The embodiments are provided for making the disclosure of the disclosure thorough and for fully conveying the scope of the disclosure to those skilled in the art to which the disclosure pertains. It is to be noted that the scope of the disclosure is defined only by the claims.

The figures, dimensions, ratios, angles, numbers of elements given in the drawings to describe embodiments of the disclosure are merely illustrative and are not limiting. Throughout the specification, like reference numerals refer to like elements. In describing the disclosure, when it is determined that the detailed description of the known related art may obscure the gist of the disclosure, the detailed description thereof will be omitted. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this may include a plural of that noun unless specifically stated otherwise.

In interpreting elements in embodiments of the disclosure, they should be interpreted as including error margins even without explicit statements.

Also, in describing the components of the disclosure, there may be terms used like first, second, A, B, (a), and (b). These are solely for the purpose of differentiating one component from the other but not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element Bi" and "an element A next to an element B," another element C may be disposed between the elements A and B unless the term "directly" or "immediately" is explicitly used.

Features of various embodiments of the disclosure may be coupled, combined or separated partially or totally. Technically various interactions and operations are possible. Various embodiments can be practiced individually or in combination.

Hereinafter, a semiconductor memory device will be described below with reference to the accompanying drawings through various examples of embodiments.

FIG. 1 is a block diagram schematically illustrating a semiconductor memory device in accordance with an embodiment.

Referring to FIG. 1, a semiconductor memory device 100 in accordance with an embodiment may include a memory cell array 110, a row decoder 120, a page buffer circuit 130 and a peripheral circuit 140.

The memory cell array 110 may include a plurality of memory blocks MB. Each of the memory blocks MB may include a plurality of memory cells. Each memory cell may be accessed by a row line RL and a bit line BL. Each memory cell may be a volatile memory cell which loses data stored therein in the case where power supply is interrupted, or may be a nonvolatile memory cell which retains data stored therein even though power supply is interrupted. While it is described below that the semiconductor memory device 100 is a vertical NAND flash device, it is to be understood that the technical spirit of the present disclosure is not limited thereto.

The row decoder 120 may be coupled to the memory cell array 110 through row lines RL. The row lines RL may include at least one drain select line, a plurality of word lines and at least one source select line. The row decoder 120 may select one among the memory blocks MB of the memory cell array 110 depending on a row address X_A. The row decoder 120 may transfer an operating voltage X_V from the peripheral circuit 140, for example, a program voltage (Vpgm), a pass voltage (Vpass) and a read voltage (Vread), to row lines RL which are coupled to a selected memory block. For transferring the operating voltage the row decoder 120 may include a plurality of pass transistors which are respectively coupled to the row lines RL.

The page buffer circuit 130 may be coupled to the memory cell array 110 through bit lines BL. The page buffer circuit 130 may include a plurality of page buffers PB which are respectively coupled to the bit lines BL. The page buffer circuit 130 may receive a page buffer control signal PB_C from the peripheral circuit 140, and may transmit and receive a data signal DATA to and from the peripheral circuit 140. The page buffer circuit 130 may control the bit lines BL which are coupled to the memory cell array 110, in response to the page buffer control signal PB_C. For example, the page buffer circuit 130 may detect data stored in a memory cell of the memory cell array 110 by sensing the signal of a bit line BL of the memory cell array 110 in response to the page buffer control signal PB_C, and may transmit the data signal DATA to the peripheral circuit 140 depending on the detected data. The page buffer circuit 130 may apply a signal to a bit line BL based on the data signal DATA received from the peripheral circuit 140 in response to the page buffer control signal PB_C, and thereby, may write data in a memory cell of the memory cell array 110. The page buffer circuit 130 may write data in or read data from a memory cell which is coupled to a word line to be activated by the row decoder 120.

The peripheral circuit 140 may receive a command signal CMD, an address signal ADD and a control signal CTRL from outside the semiconductor memory device 100, and may exchange data DATA with an external device. The peripheral circuit 140 may output signals for writing data DATA in the memory cell array 110 or reading data DATA from the memory cell array 110, for example, the row address X_A, the page buffer control signal PB_C and so forth, based on the command signal CMD, the address signal ADD and the control signal CTRL. The peripheral circuit 140 may generate various voltages including the operating voltage X_V, which are required in the semiconductor memory device 100.

Hereinbelow, in the accompanying drawings, two directions that are parallel to the top surface of a substrate and intersect with each other are defined as a first direction FD and a second direction SD, respectively, and a direction that vertically projects from the top surface of the substrate is defined as a third direction TD. The first direction FD may correspond to the extending direction of word lines or/and the arrangement direction of bit lines, and the second direction SD may correspond to the extending direction of the bit lines or/and the arrangement direction of the word lines. The first direction FD and the second direction SD may intersect substantially perpendicularly with each other. In the drawings, a direction indicated by an arrow and a direction opposite thereto represent the same direction. The third direction TD may correspond to a direction that is perpendicular to a plane extending in the first direction FD and the second direction SD. In the following descriptions, the term 'vertical' or 'vertical direction' will be used as substantially the same meaning as the third direction TD.

Figure 2:
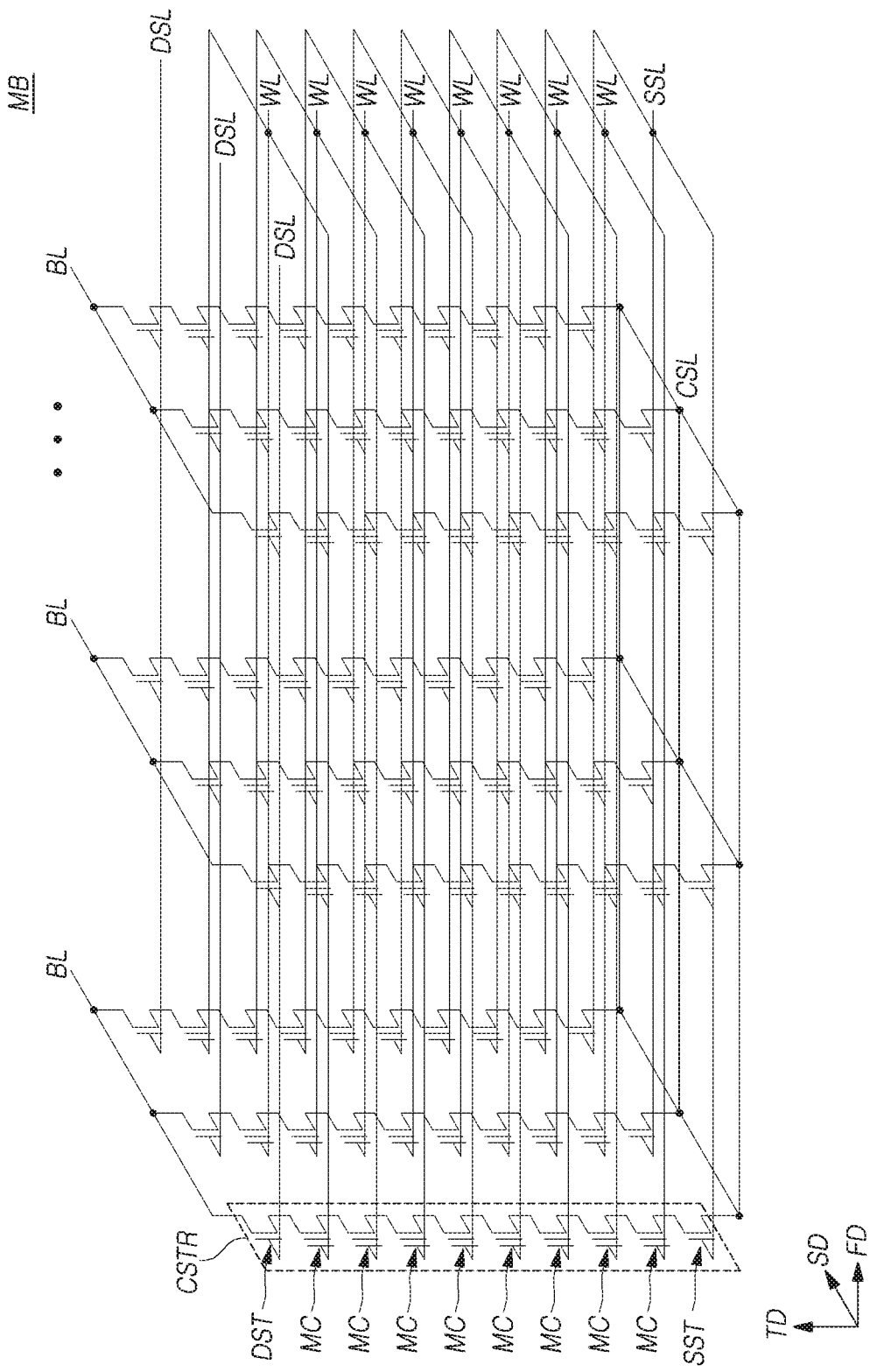
FIG. 2 is an equivalent circuit diagram illustrating a configuration of one of the memory blocks employed in the semiconductor memory device illustrated in FIG. 1 in accordance with an embodiment of the present invention.

FIG. 2 is an equivalent circuit diagram illustrating one of the memory blocks MB illustrated in FIG. 1 according to an embodiment of the present invention.

Referring to FIG. 2, a memory block MB may include a plurality of cell strings CSTR which are coupled between a plurality of bit lines BL and a common source line CSL.

The bit lines BL may extend in the second direction SD, and may be arranged in the first direction FD. A plurality of cell strings CSTR may be coupled in parallel to each of the bit lines BL. The cell strings CSTR may be coupled in common to the common source line CSL. In this case, the plurality of cell strings CSTR may be disposed between the plurality of bit lines BL and one common source line CSL.

Each of the cell strings CSTR may include a drain select transistor DST which is coupled to a bit line BL, a source select transistor SST which is coupled to the common source line CSL, and a plurality of memory cells MC which are coupled between the drain select transistor DST and the source select transistor SST. The drain select transistor DST, the memory cells MC and the source select transistor SST may be coupled in series in the third direction TD.

Drain select lines DSL, a plurality of word lines WL and a source select line SSL which extend in the first direction FD may be disposed in the third direction TD between the bit lines BL and the common source line CSL. The drain select lines DSL may be respectively connected to the gates of corresponding drain select transistors DST. The word lines WL may be connected to the gates of corresponding memory cells MC, respectively. The source select line SSL may be connected to the gates of source select transistors SST.

Figure 3:
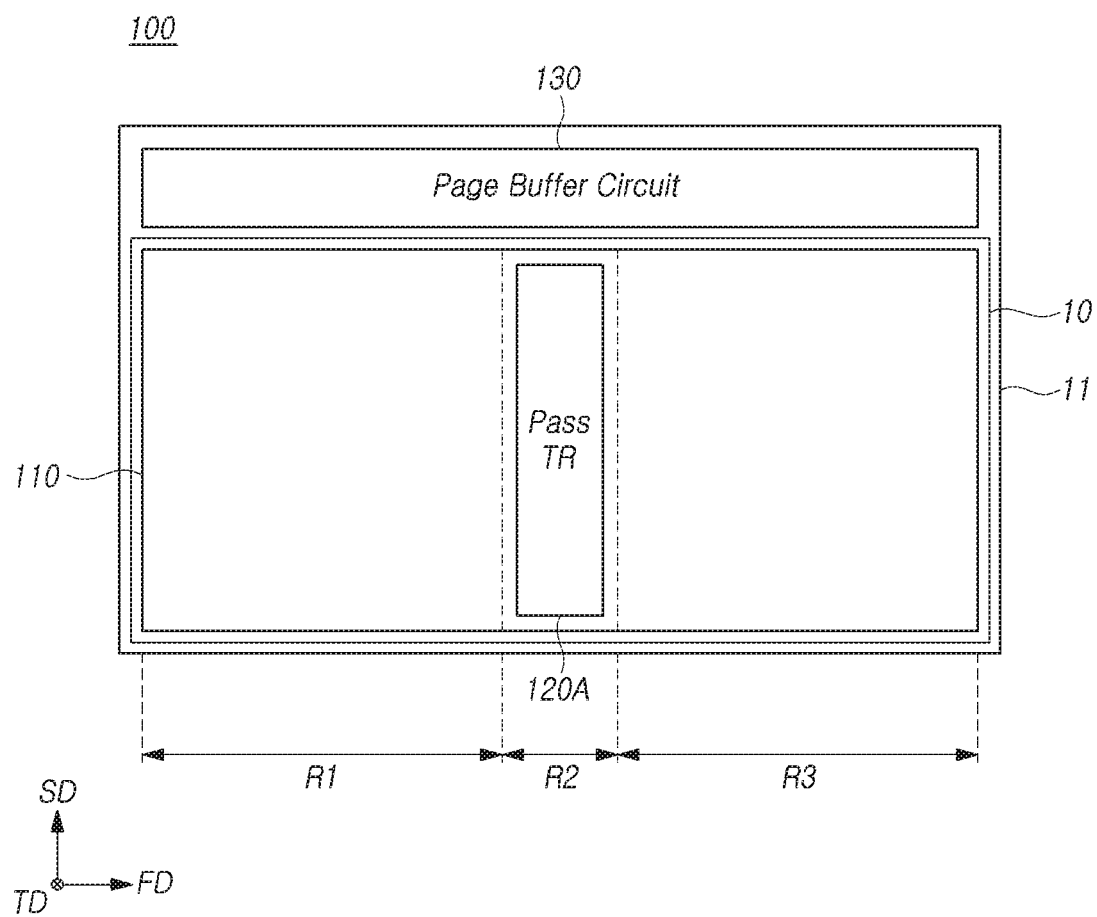
FIG. 3 is a top view schematically illustrating a configuration of a semiconductor memory device in accordance with an embodiment of the present invention.
Figure 4:
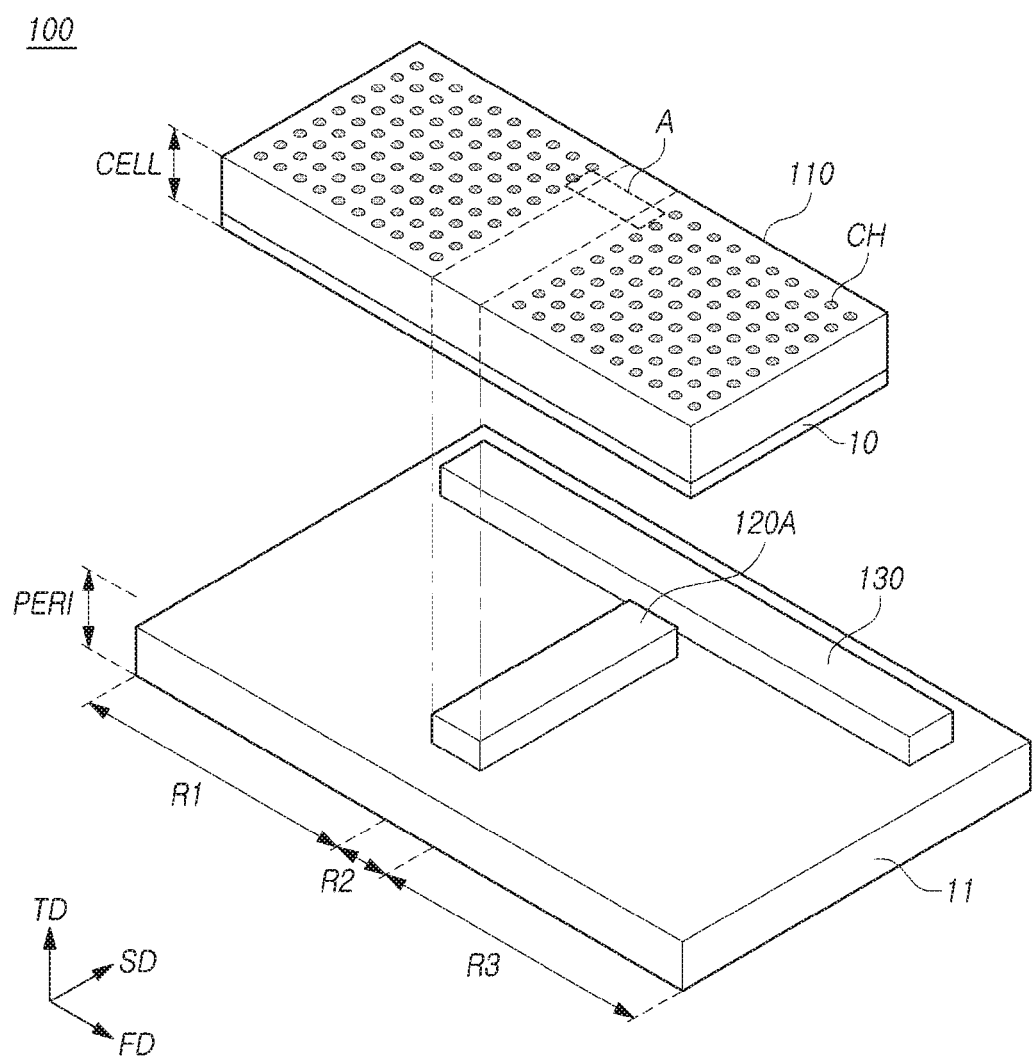
FIG. 4 is a perspective view schematically illustrating a configuration of the semiconductor memory device illustrated in FIG. 3.

FIG. 3 is a top view schematically illustrating a semiconductor memory device in accordance with an embodiment, and FIG. 4 is a perspective view of the semiconductor memory device illustrated in FIG. 3.

The semiconductor memory device 100 may have a PUC (peri under cell) structure. Referring to FIGS. 3 and 4, a logic structure PERI including a pass transistor circuit 120A, a page buffer circuit 130 and a peripheral circuit (not illustrated) may be disposed under a memory structure CELL. The memory structure CELL may include a memory cell array 110. The pass transistor circuit 120A as a component included in the row decoder 120 illustrated in FIG. may include a plurality of pass transistors. The memory structure CELL may include a first substrate 10, and the logic structure PERI may include a second substrate 11. The memory cell array 110 may be disposed on the first substrate 10, and the pass transistor circuit 120A, the page buffer circuit 130 and the peripheral circuit (not illustrated) may be disposed on the second substrate 11.

At least a part of the logic structure PERI may be disposed under the memory cell array 110, and thereby, may overlap with the memory cell array 110 in the vertical direction. The embodiment described with reference to FIGS. 3 and 4 illustrates that the pass transistor circuit 120A of the logic structure PERI overlaps with the memory cell array 110 in the vertical direction.

The semiconductor memory device 100 may include a first region R1, a second region R2 which extends from the first region R1 in the first direction FD, and a third region R3 which extends from the second region R2 in the first direction FD. The memory cell array 110 may be disposed on the first to third regions R1 to R3 of the first substrate 10.

While not illustrated, the memory cell array 110 may include a plurality of electrodes and a plurality of interlayer dielectric layers which are alternately stacked in the third direction TD, and a plurality of vertical channels (e.g. semiconductor pillars) which pass through the plurality of electrodes and the plurality of interlayer dielectric layers. The reference symbol CH of FIG. 4 denotes channel structures. Each of the channel structures CH may include a channel layer 40 and a gate dielectric layer 42 as will be described later with reference to FIG. 6.

The pass transistor circuit 120A may be disposed on the second region R2 of the second substrate 11. The pass transistor circuit 120A may include a plurality of pass transistors which transfer operating voltages to the electrodes of the memory cell array 110. The pass transistor circuit 120A may have an elongated linear shape with its long axis extending in the second direction SD. In the first direction FD, the pass transistor circuit 120A may be coextensive with the second region R2.

The page buffer circuit 130 may be disposed to have an elongated linear shape with its long axis extending in the first direction FD in the vicinity of an edge of the second substrate 11. The page buffer circuit 130 may traverse the first to third regions R1 to R3 in the first direction FD. The elements included in the page buffer circuit 130, that is, page buffers (PB of FIG. 1), may be arranged in the first direction FD.

While not illustrated, a wiring line structure including contact plugs and wiring lines which electrically couple the electrodes of the memory cell array 110 and the pass transistor circuit 120A may be defined in the second region R2. In order for coupling with the wiring line structure, the memory cell array 110 may include a step structure in the second region R2.

As the degree of integration of a semiconductor memory device increases, the numbers of electrodes included in the memory cell array 110 and pass transistors which transfer operating voltages to the electrodes are increasing. Accordingly, as the number of wiring lines which couple the electrodes and the pass transistors increases and the structure of the wiring lines is complicated, it becomes difficult to design wiring lines.

As one method for solving the difficulty in designing wiring lines, there may be a method of increasing the size of a unit memory block and thereby reducing the number of memory blocks. Since the number of pass transistors decreases if the number of memory blocks is reduced, the number of wiring lines which couple the pass transistors and the electrodes of the memory cell array 110 may be reduced. However, since the number of cell strings included in the unit memory block increases if the size of a unit memory block is increased, the possibility of a memory block to fail increases. Therefore, the number of spare memory blocks for replacing fail memory blocks needs to be increased. However, because a chip size increases if the number of spare memory blocks is increased, the number of chips per unit wafer, that is, a net die, decreases.

As another method for solving the difficulty in designing wiring lines, there may be a method of increasing the number of wiring line layers. Since an area to be used for layout of wiring lines is increased if the number of wiring line layers is increased, the degree of freedom in designing wiring lines increases, and thereby, it is easy to design wiring lines. However, as the fabrication cost of a semiconductor memory device increases if the number of wiring line layers is increased, the price competitiveness of a product deteriorates.

Embodiments of the present invention disclosure provide a semiconductor memory device capable of solving the difficulty in designing wiring lines without an increase in the size of a memory block and an increase in the number of wiring line layers.

Figure 5A:
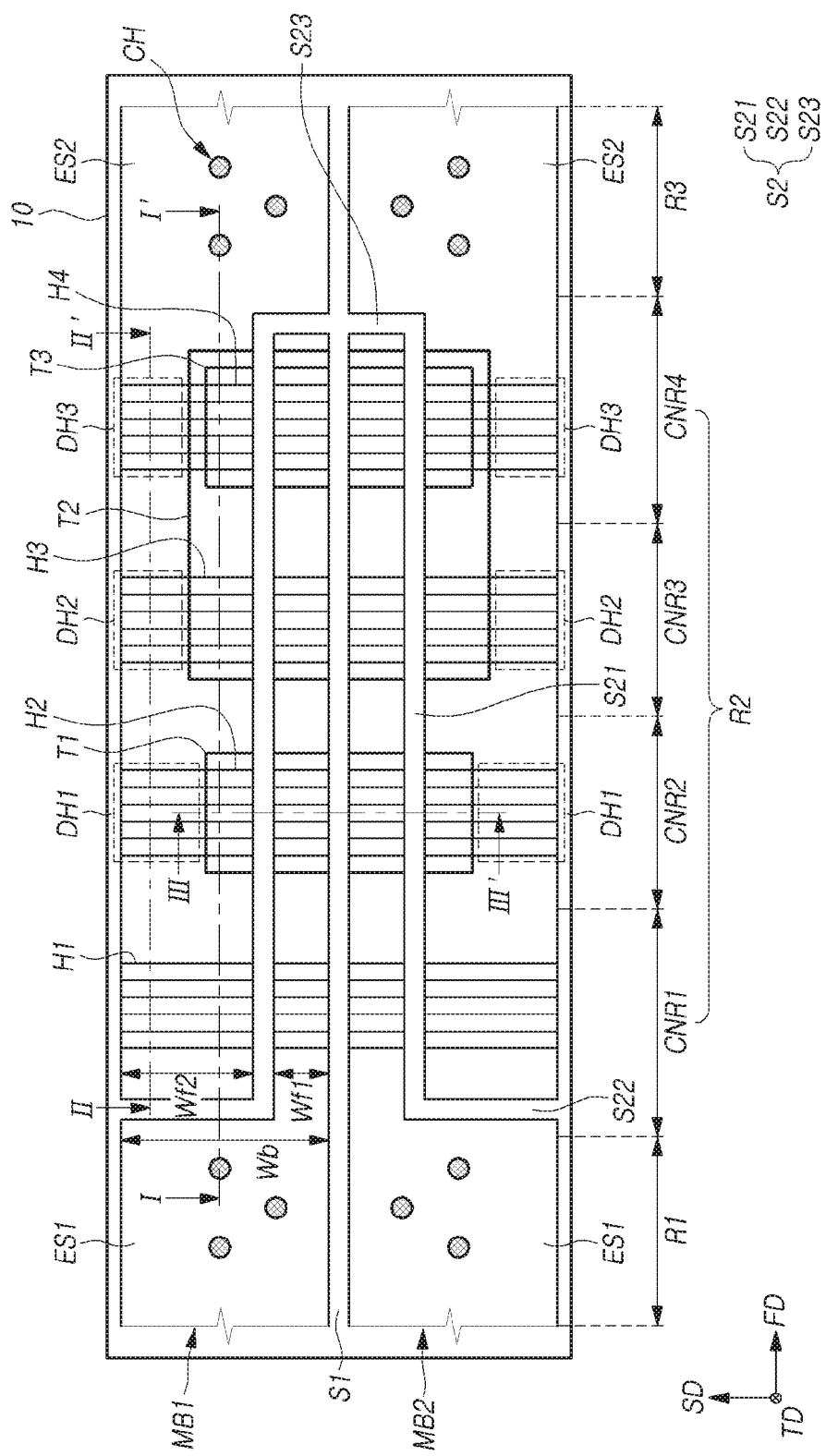
FIG. 5A is an enlarged top view illustrating part A of FIG. 4.
Figure 5B:
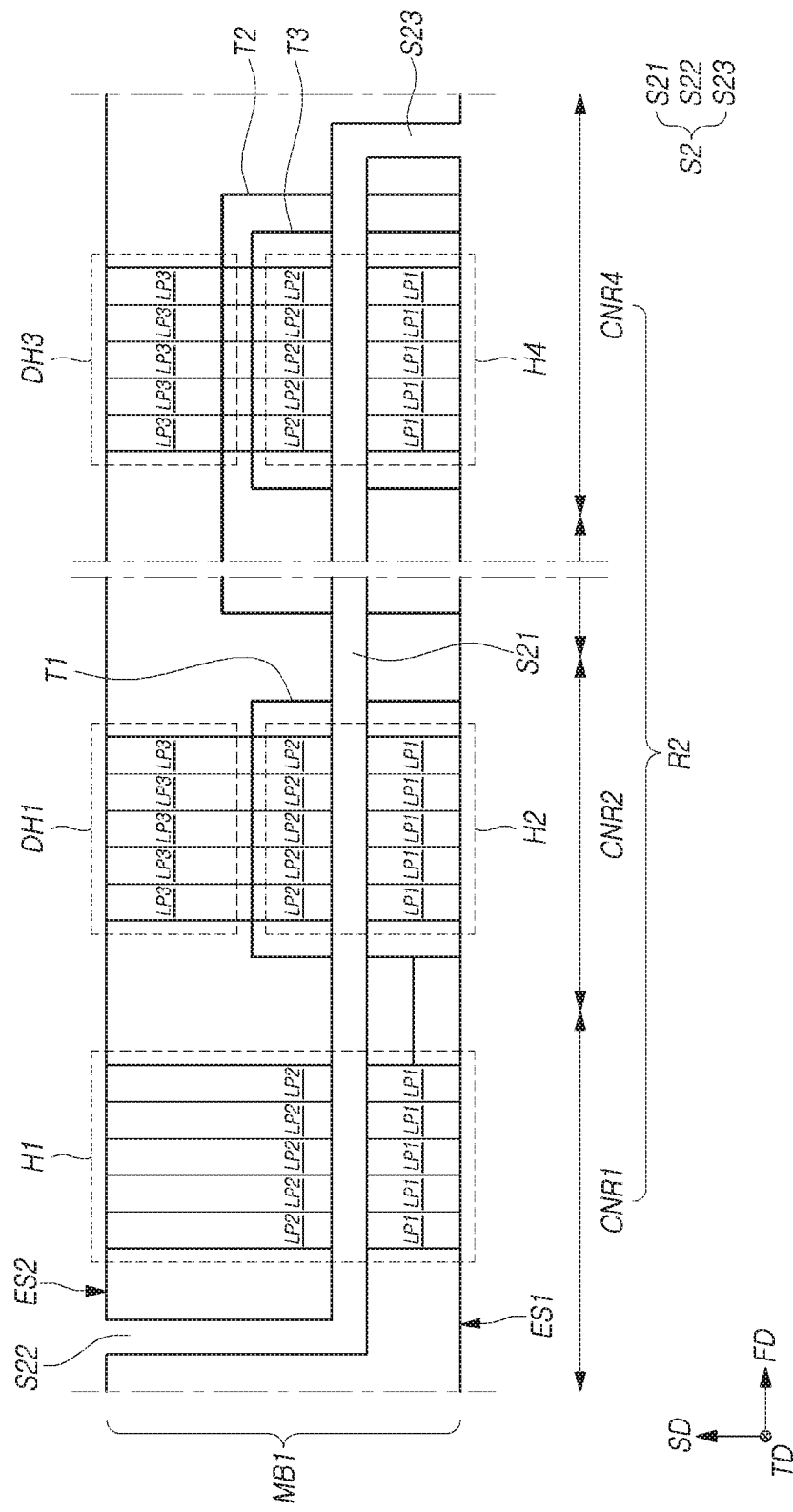
FIG. 5B is an enlarged top view illustrating a part of FIG. 5A.

FIG. 5A is an enlarged top view illustrating part A of FIG. 4, and FIG. 5B is an enlarged top view illustrating a part of FIG. 5A.

Referring to FIGS. 5A and 5B, the first substrate 10 may include the first region R1, the second region R2 which extends from the first region R1 in the first direction FD, and the third region R3 which extends from the second region R2 in the first direction FD. The second region R2 may include a plurality of contact regions (for example, CNR1 to CNR4) which are disposed in a line in the first direction FD. Hereunder, for the sake of convenience in explanation, an example will be described in which the second region R2 includes first to fourth contact regions CNR1 to CNR4. However, it is to be noted that the embodiment is not limited thereto.

A first memory block MB1 and a second memory block MB2 may be disposed on the first to third regions R1 to R3 of the first substrate 10. The first memory block MB1 and the second memory block MB2 may be disposed adjacent to each other in the second direction SD with a first slit S1 interposed therebetween. Each of the first and second memory blocks MB1 and MB2 may have a first sidewall which faces the first slit S1 and a second sidewall which faces away from the first sidewall.

The first slit S1 may have the shape of a line extending in the first direction FD for separating the first memory block MB1 and the second memory block MB2 from each other. While not illustrated in a drawing, the memory cell array 110 (see FIG. 4) may include a plurality of pairs of first and second memory blocks MB1 and MB2, and the pairs of first and second memory blocks MB1 and MB2 may be repeatedly disposed in the second direction SD. The first direction FD may correspond to the length direction of the first and second memory blocks MB1 and MB2, and the second direction SD may correspond to the width direction of the first and second memory blocks MB1 and MB2.

Each of the first and second memory blocks MB1 and MB2 may be divided into a first electrode structure ES1 and a second electrode structure ES2 by a second slit S2 extending in the second region R2. The second slit S2 may include a first portion S21 which extends in the first direction FD, a second portion S22 which extends in the second direction SD from the first portion S21 to face away from the first slit S1, in the vicinity of an edge of the second region R2 adjacent to the first region R1, and couples the first portion S21 and the second sidewall of the first memory block MB1 or the second memory block MB2, and a third portion S23 which extends in the second direction SD from the first portion S21 to face the first slit S1, in the vicinity of an edge of the second region R2 adjacent to the third region R3, and couples the first portion S21 and the first sidewall of the first memory block MB1 or the second memory block MB2.

The first electrode structure ES1 may be disposed on the first region R1 and the second region R2, and the second electrode structure ES2 may be disposed on the third region R3 and the second region R2. In the first region R1, the first electrode structure ES1 may have substantially the same width as the first memory block MB1 or the second memory block MB2. In the second region R2, the first electrode structure ES1 may have a width smaller than the first memory block MB1 or the second memory block MB2. In the third region R3, the second electrode structure ES2 may have substantially the same width as the first memory block MB1 or the second memory block MB2. In the second region R2, the second electrode structure ES2 may have a width smaller than the first memory block MB1 or the second memory block MB2.

For example, in the case where the width of the first memory block MB1 or the second memory block MB2 is Wb, the first electrode structure ES1 may have a width of Wb in the first region R1, and may have a width of Wf1 smaller than Wb in the second region R2. The second electrode structure ES2 may have a width of Wb in the third region R3, and may have a width of Wf2 smaller than Wb in the second region R2.

In the first region R1 and the third region, the first electrode structure ES1 of the first memory block MB1 and the first electrode structure ES1 of the second memory block MB2 may be disposed adjacent to each other with the first slit S1 interposed therebetween. In the third region R3, the second electrode structure ES2 of the first memory block MB1 and the second electrode structure ES2 of the second memory block MB2 may be disposed adjacent to each other with the first slit S1 interposed therebetween.

In the second region R2, the first electrode structure ES1 of the first memory block MB1 and the first electrode structure ES1 of the second memory block MB2 may be disposed adjacent to each other with the first slit S1 interposed therebetween. In the second region R2, the first electrode structure ES1 of the first memory block MB1 and the first electrode structure ES1 of the second memory block MB2 may be disposed between the second electrode structure ES2 of the first memory block MB1 and the second electrode structure ES2 of the second memory block MB2. In the second region R2, the width of the first electrode structure ES1 may be smaller than the width of the second electrode structure ES2. For example, in the second region R2, in the case where the width of the first electrode structure ES1 is Wf1 and the width of the second electrode structure ES2 is Wf2, Wf1 may be smaller than Wf2.

A plurality of trenches T1 to T3, a plurality of step-shaped grooves H1 to H4 and a plurality of dummy step-shaped grooves DH1 to DH3 may be defined in the first and second memory blocks MB1 and MB2.

The trenches T1 to T3 may include a first trench T1 which is disposed in the second contact region CNR2, a second trench T2 which is disposed in the third and fourth contact regions CNR3 and CNR4, and a third trench T3 which is disposed in the fourth contact region CNR4 to overlap with the second trench T2. While the present embodiment illustrates that one second trench T2 is provided in common in the third and fourth contact regions CNR3 and CNR4, it is to be noted that the embodiment is not limited thereto. For example, in a variation of the described embodiment, the second trench T2 may be individually provided in each of the third and fourth contact regions CNR3 and CNR4.

When viewed from the top, each of the first to third trenches to T3 extends in the second direction SD. The first to third trenches T1 to T3 may be coextensive in the second direction SD. Each of the first to third trenches T1 to T3 may completely traverse the first electrode structures ES1 of the first and second memory blocks MB1 and MB2, and may only partially traverse the second electrode structures ES2 of the first and second memory blocks MB1 and MB2. The first to third trenches T1 to T3 may be configured to have, in the second direction SD, lengths that pass through the first electrode structures ES1, pass through the first side surfaces of the second electrode structures ES2 facing the second slits S2 but do not reach the second side surfaces of the second electrode structures ES2 which face away from the first side surfaces.

The step-shaped grooves H1 to H4 may include first to fourth step-shaped grooves H1 to H4 which are disposed in the first to fourth contact regions CNR1 to CNR4, respectively.

The first step-shaped groove H1 may be disposed in the first contact region CNR1, and may traverse substantially the entirety of the first and second memory blocks MB1 and MB2 in the second direction SD when viewed from the top.

The second step-shaped groove H2 may be disposed in the first trench T1, and may traverse substantially the entirety of the first trench T1 in the second direction SD when viewed from the top. The width of the second step-shaped groove H2 in the second direction SD may be substantially the same as the width of the first trench T1 in the second direction SD. The third step-shaped groove H3 may be disposed in the second trench T2, and may traverse substantially the entirety of the second trench T2 in the second direction SD when viewed from the top. The width of the third step-shaped groove H3 in the second direction SD may be substantially the same as the width of the second trench T2 in the second direction SD. The fourth step-shaped groove H4 may be disposed in the third trench T3, and may traverse substantially the entirety of the third trench T3 in the second direction SD when viewed from the top. The width of the fourth step-shaped groove H4 in the second direction SD may be substantially the same as the width of the third trench T3 in the second direction SD.

When viewed from the top, in the second direction SD, the second to fourth step-shaped grooves H2 to H4 may completely traverse the first electrode structures ES1 of the first and second memory blocks MB1 and MB2, and may only partially traverse the second electrode structures ES2 of the first and second memory blocks MB1 and MB2. The second to fourth step-shaped grooves H2 to H4 may be configured to have, in the second direction SD, lengths that pass through the first electrode structures ES1, pass through the first side surfaces of the second electrode structures ES2 facing the second slits S2 but do not reach the secondo side surfaces of the second electrode structures ES2 which face away from the first side surfaces.

Among the electrodes of the second electrode structure ES2, ones electrodes which are positioned at upper positions may be divided by the first step-shaped groove H1. The remaining electrodes of the second electrode structure ES2 (excluding the ones electrodes are not divided by the first to fourth step-shaped grooves H1 to H4.

The first to third trenches T1 to T3 and the first to fourth step-shaped grooves H1 to H4 may be divided by the first slit S1 and the first portions S21 of the second slits S2.

The dummy step-shaped grooves DH1 to DH3 may include first dummy step-shaped grooves DH1 which are disposed in the second contact region CNR2, second dummy step-shaped grooves DH2 which are disposed in the third contact region CNR3, and third dummy step-shaped grooves DH3 which are disposed in the fourth contact region CNR4.

The first dummy step-shaped groove DH1 may be disposed on both sides of the first trench T1 in the second direction SD, and may couple the first trench T1 and the second sidewalls of the first and second memory blocks MB1 and MB2, respectively. When viewed from the top, the first dummy step-shaped groove DH1 and the second step-shaped groove H2 may be aligned in the second direction SD.

The second dummy step-shaped groove DH2 and the third dummy step-shaped groove DH3 may be disposed on both sides of the second trench T2 in the second direction SD, and may couple the second trench T2 and the second side walls of the first and second memory blocks MB1 and MB2, respectively. When viewed from the top, the second dummy step-shaped groove DH2 and the third step-shaped groove H3 may be aligned in the second direction SD, and the third dummy step-shaped groove DH3 and the fourth step-shaped groove H4 may be aligned in the second direction SD.

The first and second memory blocks MB1 and MB2 may have symmetrical structures with respect to the first slit S1 in the second region R2. In the first and third regions R1 and R3, a plurality of channel structures CH which vertically pass through the first and second memory blocks MB1 and MB2 may be defined in each memory block. The arrangement of the channels CH in the first memory block MB1 in the first region may be symmetrical to the arrangement of the channels CH in the second memory block MB2 in the first region with respect to the first slit S1. The arrangement of the channels CH in the first memory block MB1 in the third region may be symmetrical to the arrangement of the channels CH in the second memory block MB2 in the third region with respect to the first slit S1. Hereinbelow, the semiconductor memory device 100 in accordance with the described embodiment will be described in more detail with additional reference to FIGS. 6 to 9.

Figure 6:
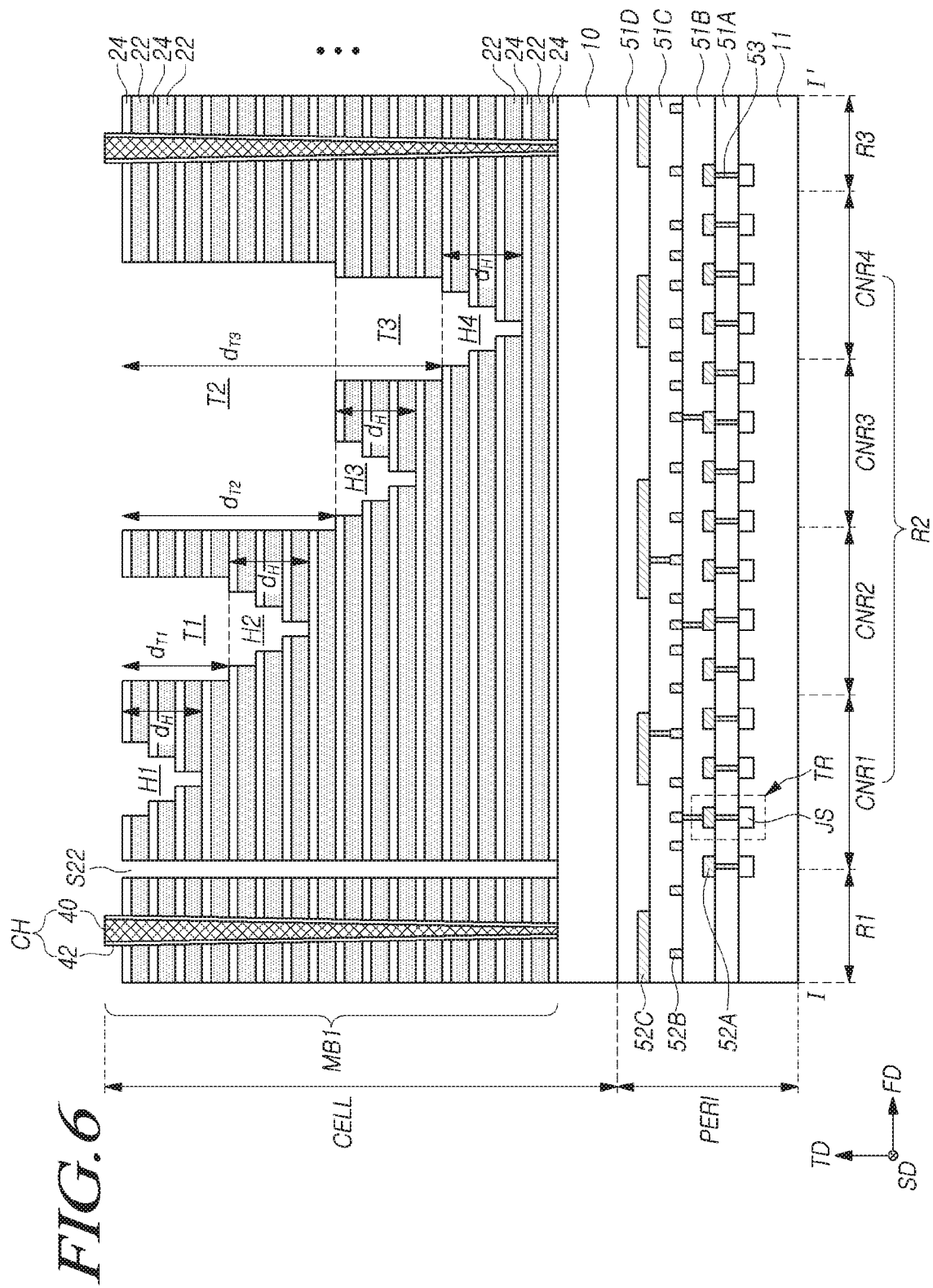
FIG. 6 is a cross-sectional view taken along the line of FIG. 5A.
Figure 7:
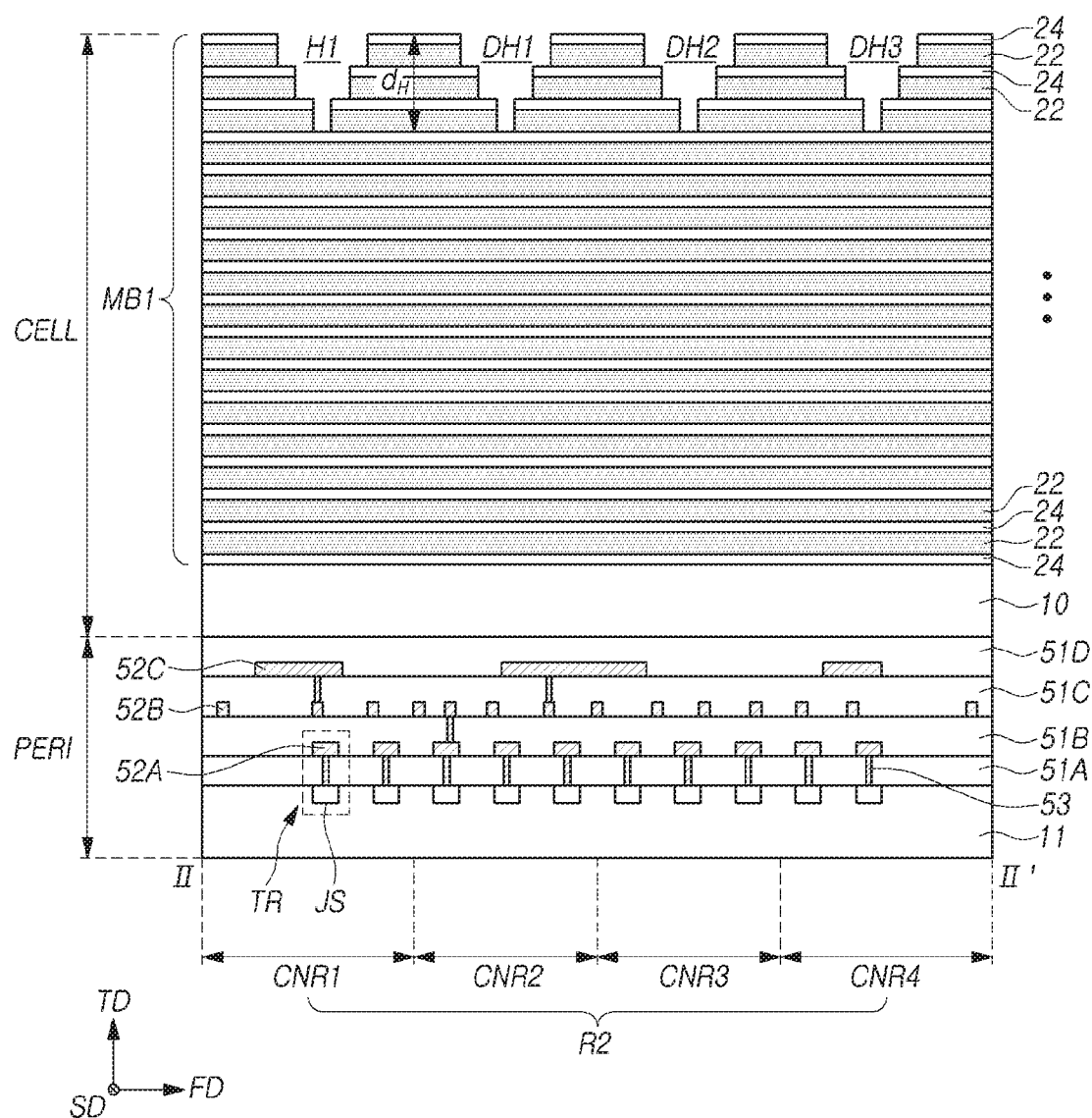
FIG. 7 is a cross-sectional view taken along the line of FIG. 5A.
Figure 8:
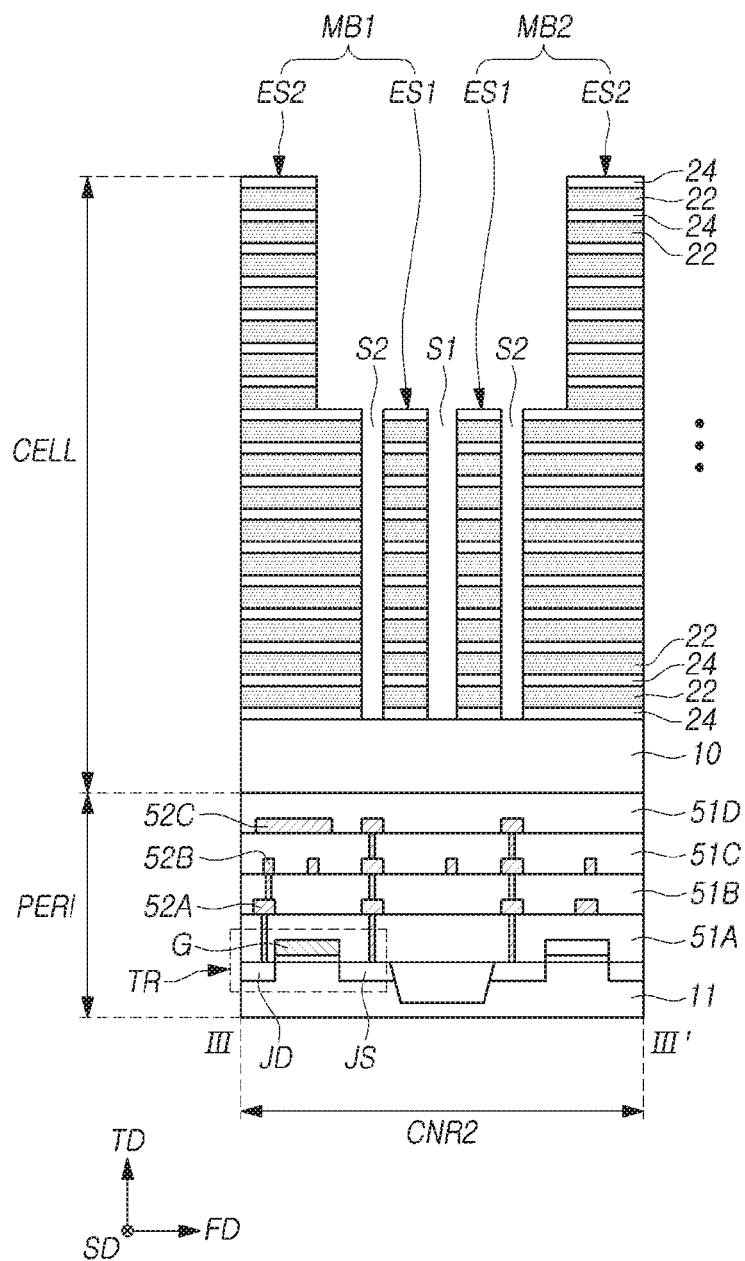
FIG. 8 is a cross-sectional view taken along the line III-III' of FIG. 5A.

FIG. 6 is a cross-sectional view taken along the line of FIG. 5A, FIG. 7 is a cross-sectional view taken along the line II-II' of FIG. 5A, FIG. 8 is a cross-sectional view taken along the line of FIG. 5A, and FIG. 9 is a perspective view schematically illustrating a part of a region where the second step-shaped groove H2 is formed in FIG. 5B.

Referring to FIGS. 6 to 8, each of the first and second memory blocks MB1 and MB2 may include a plurality of electrodes 22 and a plurality of interlayer dielectric layers 24 which are alternately stacked on the first substrate 10. The first substrate 10 may be formed of any suitable material. For example, the first substrate 10 may be formed as a polycrystalline silicon layer.

The electrodes 22 may correspond to the row lines RL described above with reference to FIG. 1. Among the electrodes 22, at least one layer from the lowermost may be used as a source select line, and at least one layer from the uppermost may be used as a drain select line. The electrodes 22 between the source select line and the drain select line may be used as word lines.

The electrodes 22 may include a conductive material. For example, the electrodes 22 may include at least one conductive material selected among a doped semiconductor (e.g., doped silicon), a metal (e.g., tungsten, copper or aluminum), a conductive metal nitride (e.g., a titanium nitride or a tantalum nitride) and a transition metal (e.g., titanium or tantalum). The interlayer dielectric layers 24 may include a dielectric material. For example, the interlayer dielectric layers 24 may be formed of a silicon oxide.

The channel structures CH may vertically pass through the interlayer dielectric layers 24 and the electrodes 22 in the first and third regions R1 and R3. Each of the channel structures CH may include the channel layer 40 and the gate dielectric layer 42. The channel layer 40 may, for example, include polysilicon or monocrystalline silicon, and may include a P-type impurity such as boron (B) in some regions thereof. The channel layer 40 may have the shape of a pillar such as, for example, the shape of a solid cylinder which is completely filled up to its center. While not illustrated, in a variation of described embodiment, the channel layer 40 may have the shape of a tube (or straw) of which the center region is open. The tube may have a cylindrical tube. In this case, a buried dielectric layer may be formed in the open center region of the channel layer 40.

The gate dielectric layer 42 may have the shape of a tube (or straw) e.g., a cylindrical tube forming a shell which surrounds the outer wall of the channel layer 40. While not illustrated, the gate dielectric layer 42 may include a tunnel dielectric layer, a charge storage layer and a blocking layer which are sequentially stacked from the outer wall of the channel layer 40. The tunnel dielectric layer may include a silicon oxide, a hafnium oxide, an aluminum oxide, a zirconium oxide or a tantalum oxide. The charge storage layer may include a silicon nitride, a boron nitride, a silicon boron nitride or a polysilicon doped with an impurity. The blocking layer may include a single layer or a stack layer of a silicon oxide, a silicon nitride, a hafnium oxide, an aluminum oxide, a zirconium oxide and a tantalum oxide. In some embodiments, the gate dielectric layer 42 may have an ONO (oxide-nitride-oxide) stack structure in which an oxide layer, a nitride layer and an oxide layer are sequentially stacked. Source select transistors, memory cells and drain select transistors may be formed where the electrodes 22 surround the channel structures CH.

The first to fourth step-shaped grooves H1 to H4, the first to third dummy step-shaped grooves DH1 to DH3 and the first to third trenches T1 to T3 may at least partially pass through the first and second memory blocks MB1 and MB2 in the second region R2.

The bottom surfaces of the first to third trenches T1 to T3 may be disposed at different depths. The bottom surface of the first trench T1 may be disposed at a first depth dT1 from the top surfaces of the first and second memory blocks MB1 and MB2. The bottom surface of the second trench T2 may be disposed at a second depth dT2 deeper than the first depth dT1 from the top surfaces of the first and second memory blocks MB1 and MB2. The bottom surface of the third trench T3 may be disposed at a third depth dT3 deeper than the second depth dT2 from the top surfaces of the first and second memory blocks MB1 and MB2. Due to this fact, heights to the bottom surfaces of the first to third trenches T1 to T3 from the top surface of the first substrate 10 may be different from one another.

Each of the first to fourth step-shaped grooves H1 to H4 may include a pair of step structures which face each other in the first direction FD and are symmetrical to each other relative to an axis of symmetry which extends in the third direction TD and crosses the center of the respective step-shaped groove. The step structures of the first to fourth step-shaped grooves H1 to H4 may include the same number of steps. The height of each of the steps may correspond to the vertical pitch of the electrodes 22. In the illustrated embodiment, as an example, the number of steps of each of the step structures of the first to fourth step-shaped grooves H1 to H4 is shown to be three.

The first step-shaped groove H1 may be provided in a shape which is recessed into the first and second memory blocks MB1 and MB2 from the top surfaces of the first and second memory blocks MB1 and MB2. The second step-shaped groove H2 may be provided in a shape which is recessed into the first and second memory blocks MB1 and MB2 from the bottom surface of the first trench T1. The third step-shaped groove H3 may be provided in a shape which is recessed into the first and second memory blocks MB1 and MB2 from the bottom surface of the second trench T2. The fourth step-shaped groove H4 may be provided in a shape which is recessed into the first and second memory blocks MB1 and MB2 from the bottom surface of the third trench T3.

The first to fourth step-shaped grooves H1 to H4 may have the same depth dH. Because the first to fourth step-shaped grooves H1 to H4 are formed to the same depth from surfaces which are disposed at different heights, the bottom surfaces of the first to fourth step-shaped grooves H1 to H4 may be disposed at different heights.

As illustrated in FIGS. 5B and 9, each of the electrodes 22 included in the first electrode structure ES1 may have a first pad region LP1 which is exposed by another electrode 22 positioned thereon, in any one of the first to fourth step-shaped grooves H1 to H4. The width of the first pad regions LP1 in the second direction SD may be substantially the same as the width of the first electrode structure ES1 in the second region R2.

Each of the electrodes 22 included in the second electrode structure ES2 may have a second pad region LP2 which is exposed by another electrode 22 positioned thereon, in any one of the first to fourth step-shaped grooves H1 to H4. The widths of the second pad regions LP2 in the second direction SD may be substantially the same as the widths of the step-shaped grooves H1 to H4 defined in the second electrode structure ES2 in the second direction SD.

When viewed from the top, the first pad regions LP1 may be disposed in a line in the first direction FD while facing the first portion S21 of the second slit S2. When viewed from the top, the second pad regions LP2 may be disposed in a line in the first direction FD while facing the first portion S21 of the second slit S2. The first pad regions LP1 and the second pad regions LP2 may be disposed side by side with the first portion S21 of the second slit S2 interposed therebetween.

In each of the first and second memory blocks MB1 and MB2, the first pad regions LP1 of the electrodes 22 of the first electrode structure ES1 and the second pad regions LP2 of the electrodes 22 of the second electrode structure ES2 which are positioned in the same step-shaped groove and are disposed at the same layers may be disposed adjacent to each other in the second direction SD with the second slit S2 interposed therebetween. A first pad region LP1 and a second pad region LP2 which are disposed adjacent to each other in the second direction SD with the second slit S2 interposed therebetween may be positioned at the same layer. While FIG. 9 illustrates only the second step-shaped groove H2, step-shaped grooves other than the second step-shaped groove H2 may have a similar shape.

Referring again to FIG. 7, the first to third dummy step-shaped grooves DH1 to DH3 may be provided in a shape which is recessed into the first and second memory blocks MB1 and MB2 from the top surfaces of the first and second memory blocks MB1 and MB2. Each of the first to third dummy step-shaped grooves DH1 to DH3 may include a pair of step structures which face each other in the first direction FD and are symmetrical to each other. The step structures of the first to third dummy step-shaped grooves DH1 to DH3 may include the same number of steps. The height of each of the steps may correspond to the vertical pitch of the electrodes 22. The number of steps of each of the step structures of the first to third dummy step-shaped grooves DH1 to DH3 may be the same as the number of steps of each of the step structures of the first to fourth step-shaped grooves H1 to H4.

The first to third dummy step-shaped grooves DH1 to DH3 may have the same depth dH as the first step-shaped groove H1. In this case, the bottom surfaces of the first to third dummy step-shaped grooves DH1 to DH3 may be disposed on the same plane as the bottom surface of the first step-shaped groove H1.

Referring again to FIGS. 5A, 5B and 7, in the second region R2, among the electrodes 22 of the second electrode structure ES2, some electrodes 22 which are stacked at upper positions may be divided into a plurality of portions by the first step-shaped groove H1 and the first to third dummy step-shaped grooves DH1 to DH3. Among the electrodes 22 of the second electrode structure ES2, some electrodes 22 which are stacked at upper positions may have third pad regions LP3 which are exposed by other electrodes 22 positioned thereon at regions where the first to third dummy step-shaped grooves DH1 to DH3 are formed.

Referring again to FIGS. 6 to 8, the logic structure PERI may include a plurality of logic circuit elements TR which are disposed on the second substrate 11, bottom dielectric layers 51A to 51D which are formed on the second substrate 11 and thereby cover the logic circuit elements TR, and bottom wiring lines 52A to 52C and bottom contact plugs 53 which are disposed in the bottom dielectric layers 51A to 51D and are electrically coupled to the logic circuit elements TR.

The second substrate 11 may include at least one selected from the group including a monocrystalline silicon layer, an SOI (silicon on insulator), a silicon layer formed on a silicon germanium (Site) layer, a monocrystalline silicon layer formed on a dielectric layer and a polysilicon layer formed on a dielectric layer.

The logic circuit elements TR may include planar transistors. In the case where the logic circuit elements TR are constituted by planar transistors, each of the logic circuit elements TR may include a gate G and a source/drain region JS/JD. The logic circuit elements TR may constitute the row decoder 120, the page buffer circuit 130 and the peripheral circuit 140 of FIG. 1. In an embodiment, the logic circuit elements TR disposed in the second region R2 may correspond to the pass transistors of the row decoder 120.

The bottom dielectric layers 51A to 51D may include first to fourth bottom dielectric layers 51A to 51D which are sequentially disposed on the second substrate 11. The bottom wiring lines 52A to 52C may include first bottom wiring lines 52A which are disposed on the first bottom dielectric layer 51A, second bottom wiring lines 52B which are disposed on the second bottom dielectric layer 51B and third bottom wiring lines 52C which are disposed on the third bottom dielectric layer 51C. As the bottom contact plugs 53 which pass through the first to third bottom dielectric layers 51A to 51C are formed, electrical paths which electrically couple the logic circuit elements TR and the first bottom wiring lines 52A and electrically couple the bottom wiring lines 52A to 52C disposed at different layers may be provided.

Figure 10:
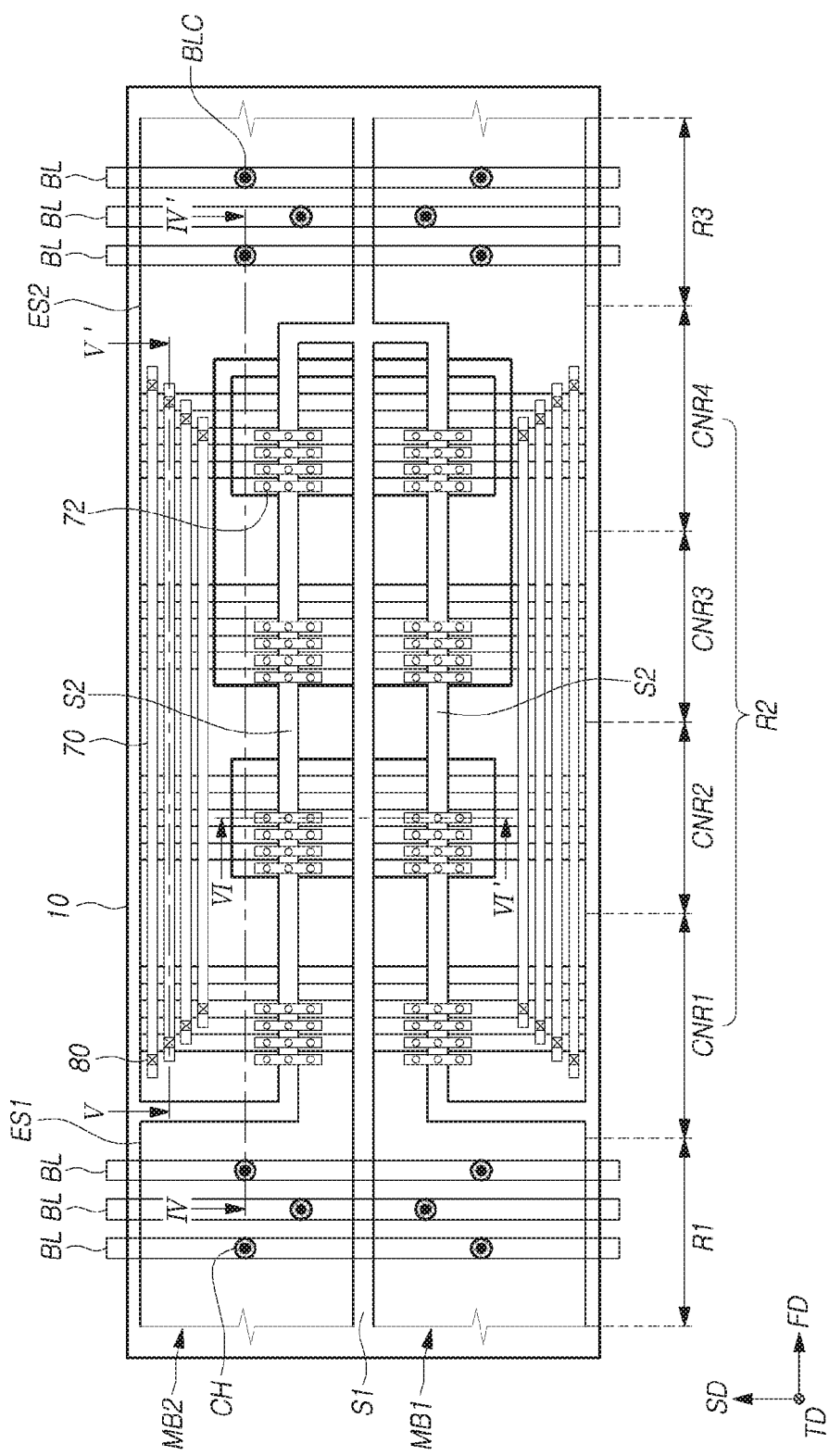
FIG. 10 is a top view of a semiconductor memory device illustrating a wiring line structure in accordance with an embodiment of the present invention.
Figure 11:
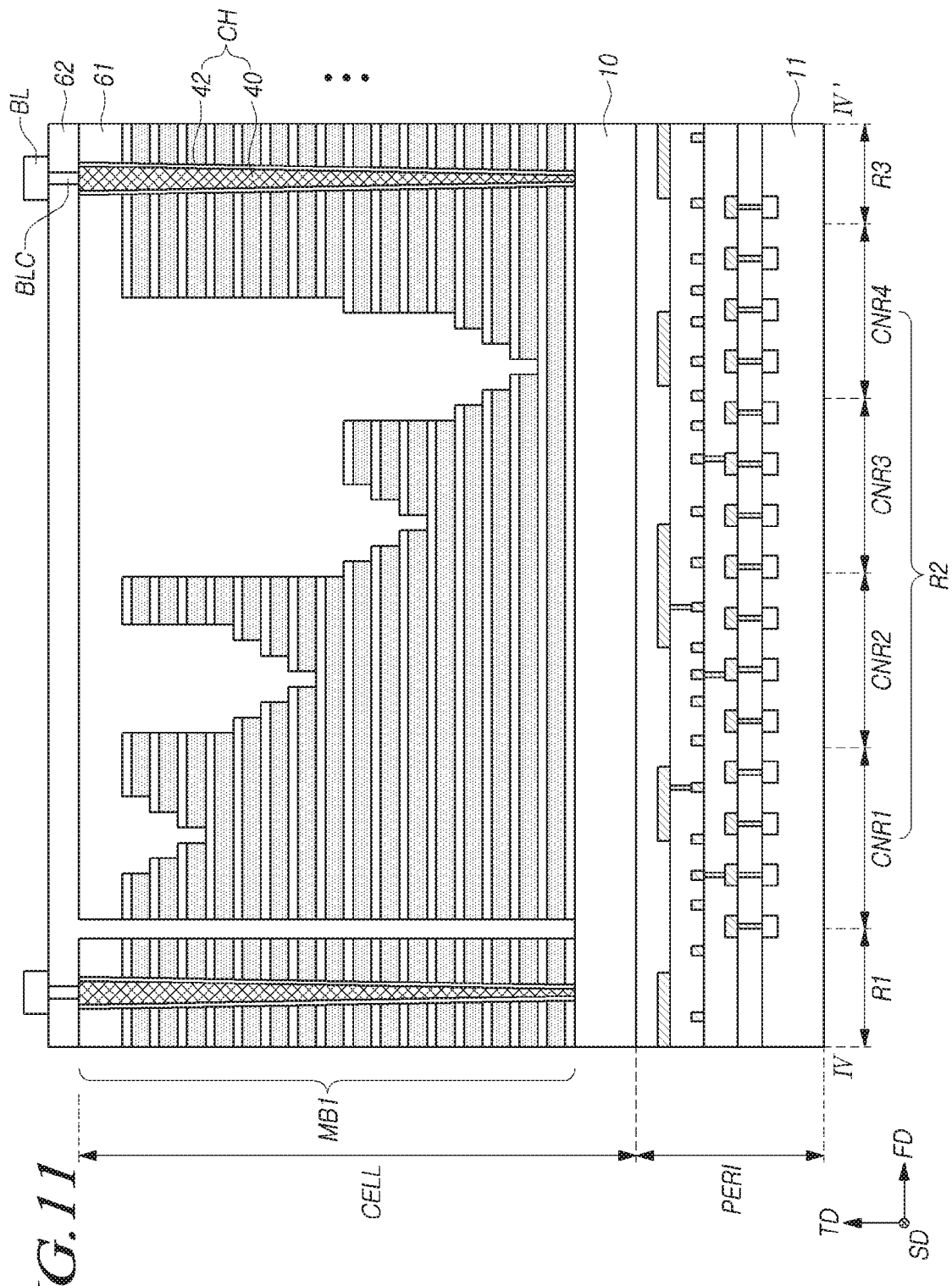
FIG. 11 is a cross-sectional view taken along the line IV-IV' of FIG. 10.
Figure 12:
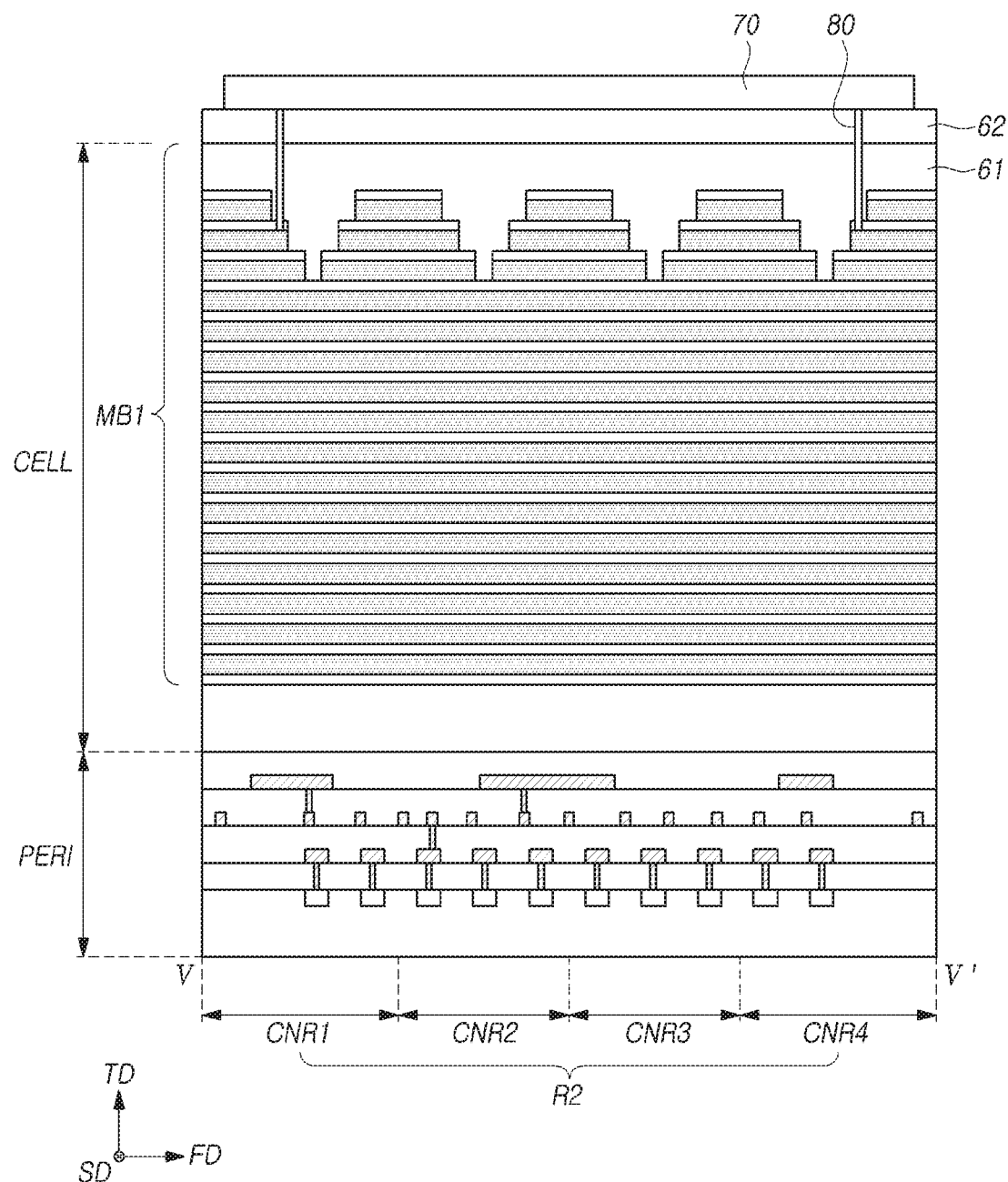
FIG. 12 is a cross-sectional view taken along the line V-V' of FIG. 10.
Figure 13:
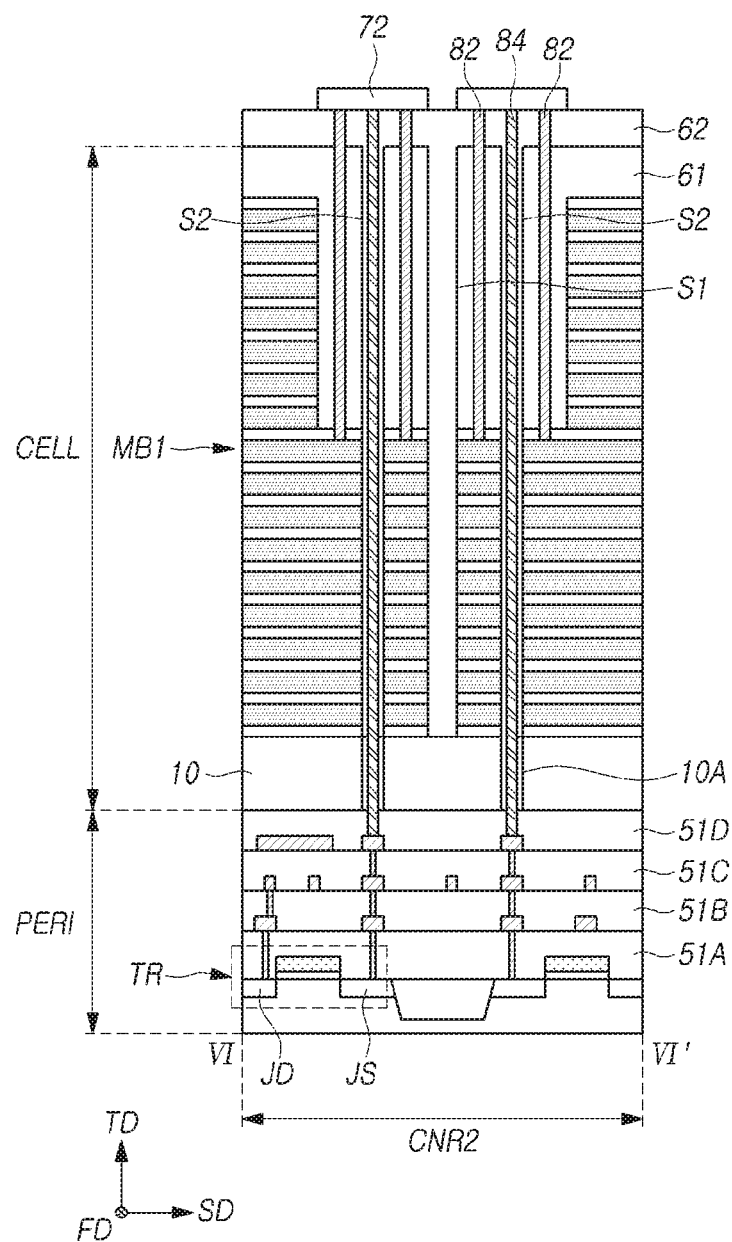
FIG. 13 is a cross-sectional view taken along the line VI-VI' of FIG. 10.

FIGS. 10 to 14 are representations of examples of views to assist in the explanation of the structure of top wiring lines in accordance with the embodiment. In detail, FIG. 10 is a top view, FIG. 11 is a cross-sectional view taken along the line IV-IV' of FIG. 10, FIG. 12 is a cross-sectional view taken along the line V-V' of FIG. 10, FIG. 13 is a cross-sectional view taken along the line VI-VI' of FIG. 10, and FIG. 14 is a perspective view schematically illustrating a part of a region where the second step-shaped groove H2 is formed in FIG. 10.

Referring to FIGS. 10 to 13, a first top dielectric layer 61 may be formed on the first and second memory blocks MB1 and MB2, and thereby, may cover the first and second memory blocks MB1 and MB2. The first top dielectric layer

61 may be passed through by the channel structures CH and the first and second slits S1 and S2. A second top dielectric layer 62 may be formed on the first top dielectric layer 61, and thereby, may fill the first and second slits S1 and S2 and cover the channel structures CH. The first and second top dielectric layers 61 and 62 may include a dielectric material, for example, a silicon oxide.

A plurality of bit lines BL may be disposed on the second top dielectric layer 62. The bit lines BL may extend in the second direction SD and may be arranged in the first direction FD. Bit line contacts BLC which pass through the second top dielectric layer 62 may be formed under the bit lines BL, and the bit lines BL may be electrically coupled to the channel layers 40 of the channel structures CH through respective bit line contacts BLC.

As described above with reference to FIGS. 5A to 9, in the second region R2, among the electrodes 22 of the second electrode structure ES2, some electrodes 22 which are stacked at upper positions may be divided by the first step-shaped groove H1 and the first to third dummy step-shaped grooves DH1 to DH3.

Since the electrodes 22 of the second electrode structure ES2 which are included in the single memory block MB1 or MB2 and are disposed at the same layers need to be equipotential, it is necessary to electrically couple the divided electrodes 22.

In order to electrically couple the divided electrodes 22, as illustrated in FIGS. 10 and 12, first top wiring lines 70 may be defined on the second top dielectric layer 62. The first top wiring lines 70 may extend in the first direction FD.

As described above with reference to FIG. 5B, among the electrodes 22 of the second electrode structure ES2, each of the electrodes 22 which are stacked at upper positions may have a second pad region LP2 which is exposed by another electrode 22 in the first step-shaped groove H1. Among the electrodes 22 of the second electrode structure ES2, some electrodes 22 which are stacked at upper positions may have third pad regions LP3 which are exposed by other electrodes 22 positioned thereon in the third dummy step-shaped groove DH3.

Referring again to FIGS. 10 and 12, contact plugs 80 which pass through the second and first top dielectric layers 62 and 61 and are coupled to the second pad regions LP2 (see FIG. 5B) of the first step-shaped groove H1 and the third pad regions LP3 (see FIG. 5B) of the third dummy step-shaped groove DH3 may be defined under the first top wiring lines 70. The respective first top wiring lines 70 may be electrically coupled to electrodes 22 which are positioned at the same layers, through the contact plugs 80. The electrodes 22 which are divided by the first step-shaped groove H1 and the third dummy step-shaped groove DH3 and are disposed at the same layers may be electrically coupled with each other by the contact plugs 80 and the first top wiring lines 70.

As described above with reference to FIGS. 5B and 9, in each of the first and second memory blocks MB1 and MB2, the first pad regions LP1 of the electrodes 22 of the first electrode structure ES1 and the second pad regions LP2 of the electrodes 22 of the second electrode structure ES2 which are positioned in the same step-shaped groove and are disposed at the same layers may be disposed adjacent to each other in the second direction SD with the second slit S2 interposed therebetween.

Since the electrodes 22 of the first electrode structure ES1 and the electrodes 22 of the second electrode structure ES2 which are included in the single memory block MB1 or MB2 and are disposed at the same layers need to be equipotential, it is necessary to electrically couple the electrodes 22 of the first electrode structure ES1 and the electrodes 22 of the second electrode structure ES2 which are disposed at the same layers in the single memory block MB1 or MB2.

In order to electrically couple the electrodes 22 of the first electrode structure ES1 and the electrodes 22 of the second electrode structure ES2 which are disposed at the same layers in the single memory block MB1 or MB2, as illustrated in FIGS. 10, 13 and 14, second top wiring lines 72 may be defined on the second top dielectric layer 62, and first contact plugs 82 may be defined under the second top wiring lines 72.

When viewed from the top, the second top wiring lines 72 may extend in the second direction SD, and may intersect with the second slit S2. The first and second ends of the second top wiring lines 72 may be disposed over the first pad regions LP1 and the second pad regions LP2, respectively, which are adjacent to each other with the second slit S2 interposed therebetween.

Each of the second top wiring lines 72 may be configured to have a short length that couples the first pad regions LP1 and the second pad regions LP2 which are disposed adjacent to each other with the second slit S2 interposed therebetween. Each of the second top wiring lines 72 may be disposed within the width Wb of the corresponding memory block MB1 or MB2 in the second direction SD, and may completely overlap with the corresponding memory block MB1 or MB2 in the vertical direction.

The first contact plugs 82 may pass through the second and first top dielectric layers 62 and 61 under the second top wiring lines 72, and thereby, may be coupled to the first pad regions LP1 (see FIG. 5B) and the second pad regions LP2 (see FIG. 5B). The first contact plugs 82 may provide electrical paths which couple the second top wiring lines 72 with the first pad regions LP1 (see FIG. 5B) and the second pad regions LP2 (see FIG. 5B). Accordingly, the first pad regions LP1 and the second pad regions LP2 which are disposed adjacent to each other in the second direction SD with the second slit S2 interposed therebetween may be electrically coupled with each other through the second top wiring lines 72 and the first contact plugs 82.

Second contact plugs 84 which pass through the second top dielectric layer 62 filled in the second slit S2 may be defined under the second top wiring lines 72. The second contact plugs 84 may be coupled to the third bottom wiring lines 52C by passing through the second top dielectric layer 62 filled in the second slit S2, the first substrate 10 and the fourth bottom dielectric layer 51D. The second top wiring lines 72 may be electrically coupled to the logic circuit elements TR, for example, the source regions JS of the pass transistors, through the bottom wiring lines 52A to 52C and the bottom contact plugs 53.

A dielectric layer 10A may be formed between the second contact plugs 84 and the first substrate 10, and thereby, may electrically isolate the second contact plugs 84 and the first substrate 10 from each other. The dielectric layer 10A may also surround the entire length of each of the second contact plugs 84 to prevent electrical contact with any of the electrodes 22.

According to the present embodiment, the pad regions LP1 of the electrodes 22 of the first electrode structure ES1 and the pad regions LP2 of the electrodes 22 of the second electrode structure ES2 which need to be equipotential are disposed adjacent to each other in the second direction SD with the second slit S2 interposed therebetween. Therefore, the second top wiring lines 72 which couple the electrodes 22 of the first electrode structure ES1 and the electrodes 22 of the second electrode structure ES2 may be formed to have only a short length that couples the first pad regions LP1 and the second pad regions LP2 which are disposed adjacent to each other with the second slit S2 interposed therebetween.

Moreover, because the second slit S2 which intersects with the second top wiring lines 72 is provided in each of the memory blocks MB1 and MB2, vertical paths which couple the second top wiring lines 72 and the pass transistors, that is, the second contact plugs 84, may be disposed in the memory block MB. Thus, it is not necessary to extend the second top wiring lines 72 out of the layout regions of the memory blocks MB1 and MB2 to form vertical paths by avoiding the electrodes 22 of the memory blocks MB1 and MB2. Due to this fact, since the second top wiring lines 72 may be disposed in such a way to completely overlap with the corresponding memory block MB1 or MB2 in the vertical direction, it is possible to suppress an increase in the size of a semiconductor memory device due to the presence of the second top wiring lines 72.

FIGS. 15A to 21B are representations of examples of views to assist in the explanation of a method for manufacturing a semiconductor memory device in accordance with an embodiment. In detail, FIGS. 15A to 21A are top views illustrating the semiconductor memory device in accordance with the embodiment according to a manufacturing sequence, and FIGS. 15B to 21B are cross-sectional views taken along the lines VII-VII' of FIGS. 15A to 21A.

Referring to FIGS. 15A and 15B, a logic structure PERI may be defined on a second substrate 11, and a first substrate 10 may be defined on the logic structure PERI.

The second substrate 11 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer. The first substrate 10 may be formed as a polycrystalline silicon layer. Since the first substrate 10 needs to be formed on the logic structure PERI unlike the second substrate 11 which may use a monocrystalline silicon layer, the first substrate 10 may be formed as a polycrystalline silicon layer.

As first material layers 24 and second material layers 26 are alternately stacked on the first substrate 10, a pre-stack PS may be formed. The first material layers 24 and the second material layers 26 may be formed of different materials. For example, the first material layers 24 may be formed of a dielectric material suitable for interlayer dielectric layers, and the second material layers 26 may be used as sacrificial layers and be formed of a dielectric material which has an etching selectivity with respect to the first material layers 24 so that the second material layers 26 may be selectively removed by etching without removing the first material layers 24. For example, the first material layers 24 may be formed of a silicon oxide, and the second material layers 26 may be formed of a silicon nitride.

A first mask pattern PR1 having slit-shaped openings which are spaced apart, preferably at a regular interval, to overlap first to fourth contact regions CNR1 to CNR4, respectively, may be formed on the pre-stack PS. The first mask pattern PR1 may be formed by a method of forming a photoresist on the pre-stack PS and patterning the photoresist through exposure and development processes.

Then, the pre-stack PS may be etched by a pad etching process using the first mask pattern PR1 as an etch mask. An etching thickness of the pad etching process may correspond to a vertical pitch P1 of the second material layers 26.

Referring to FIGS. 16A and 16B, a trimming process may be performed for the first mask pattern PR1. For example, an isotropic etching process may be performed for trimming the first mask pattern PR1. The trimming process may be performed by using an etchant capable of removing the first mask pattern PR1. Accordingly, the height and width of the first mask pattern PR1 may be reduced. As the width of the first mask pattern PR1 is reduced, the width of the openings may be widened symmetrically along all sides of the initial openings.

The processes described above with reference to FIGS. 15A to 16B may constitute one cycle for forming one step in the first to fourth contact regions CNR1 to CNR4. That is to say, the cycle may include the pad etching process of etching the pre-stack PS of the first to fourth contact regions CNR1 to CNR4 which are exposed by the first mask pattern PR1, by the thickness corresponding to the vertical pitch P1 of the second material layers 26, through using the first mask pattern PR1 as an etch mask, and the trimming process of reducing the width of the first mask pattern PR1.

Figure 17B:
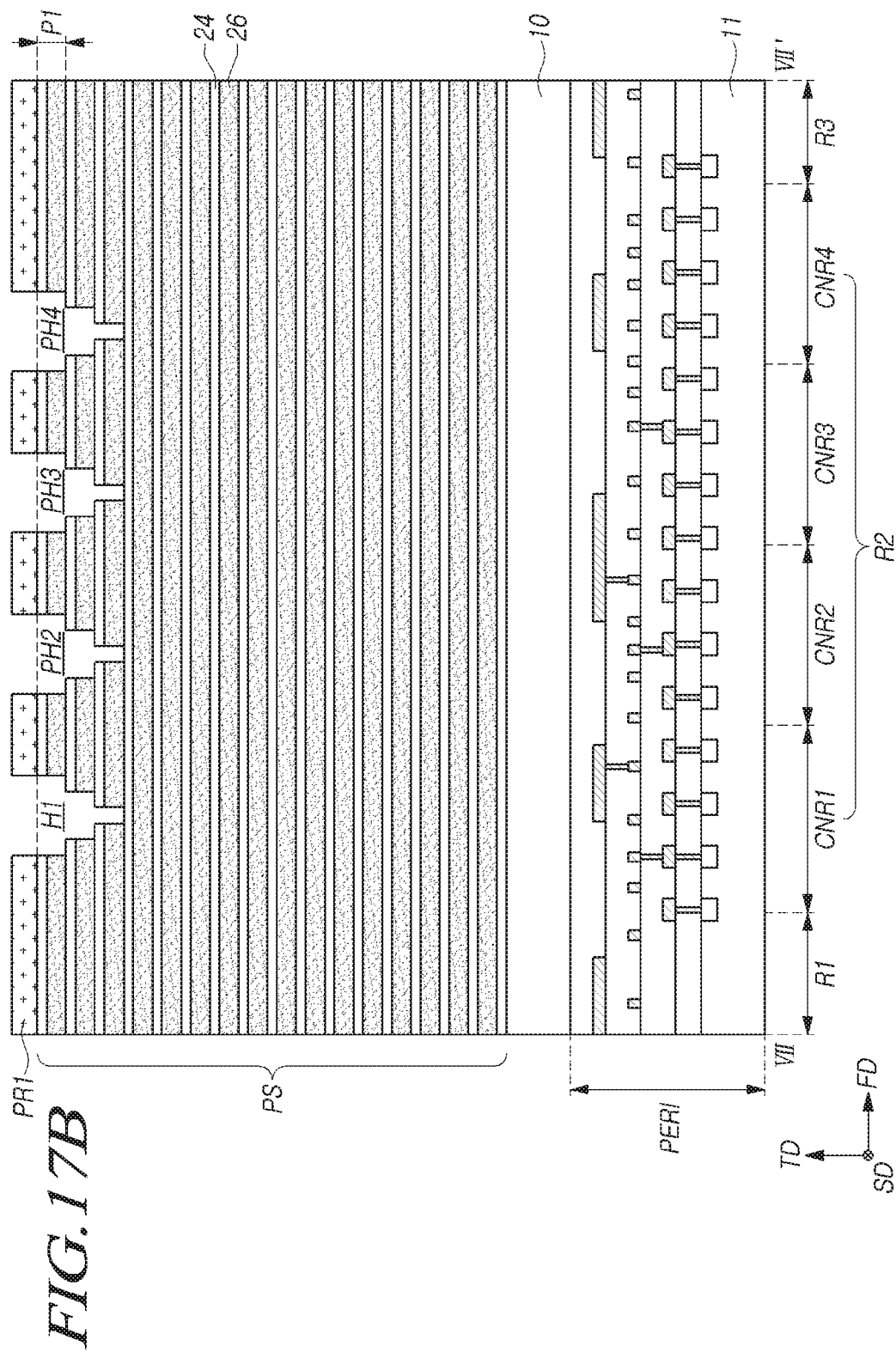

Referring to FIGS. 17A and 17B, as the cycle is repeated N times (N is a natural number of 2 or greater), a first step-shaped groove H1 and pre-second to fourth step-shaped grooves PH2 to PH4 may be formed in the first to fourth contact regions CNR1 to CNR4, respectively. When viewed from the top, the first step-shaped groove H1 and the pre-second to fourth step-shaped grooves PH2 to PH4 may traverse the pre-stack PS in the second direction SD. Each of the first step-shaped groove H1 and the pre-second to fourth step-shaped grooves PH2 to PH4 may include a pair of step structures which face each other in the first direction FD and are symmetrical to each other. The first mask pattern PR1 may be removed after forming the first step-shaped groove H1 and the pre-second to fourth step-shaped grooves PH2 to PH4.

Figure 18A:
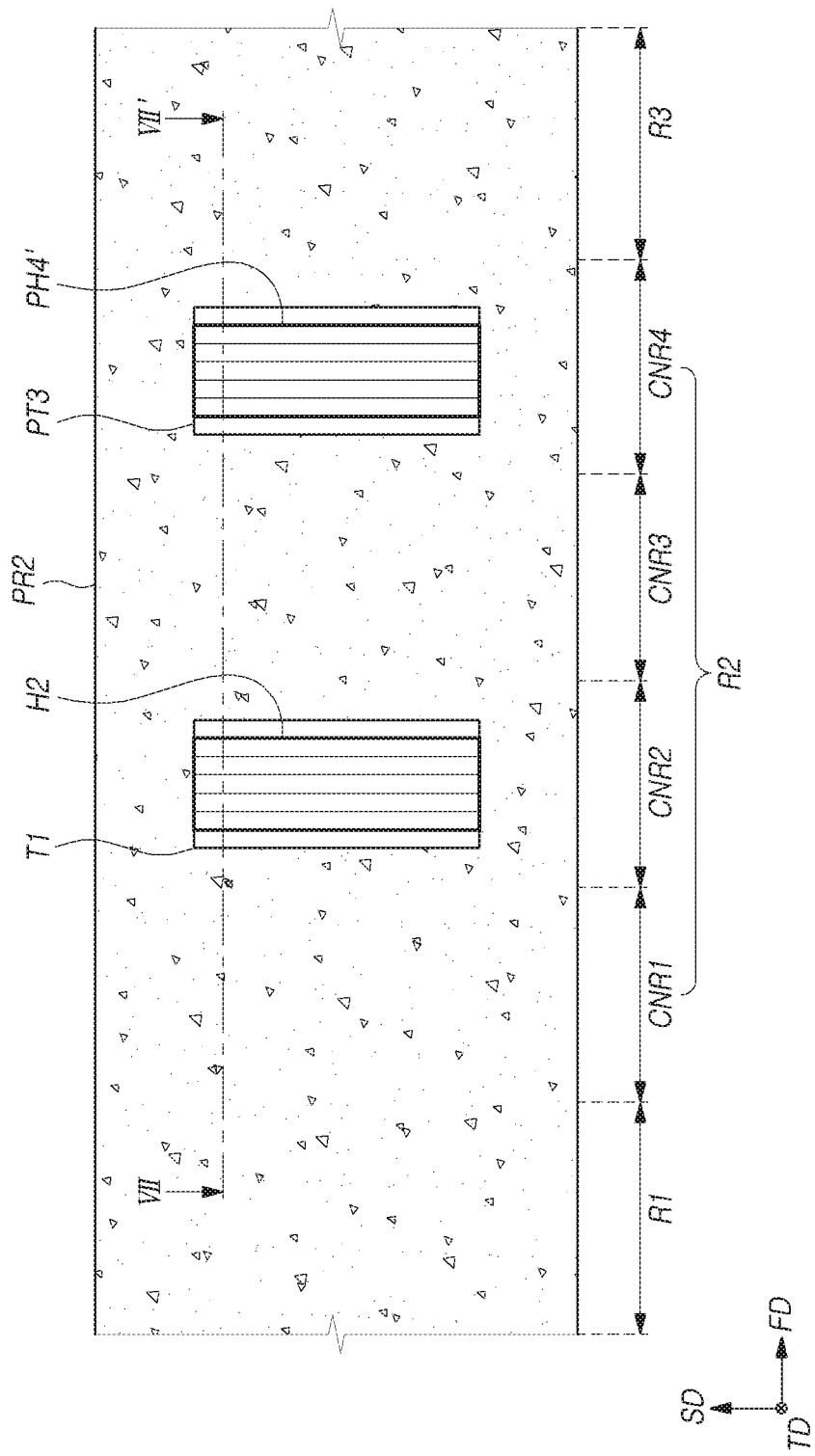

Referring to FIGS. 18A and 18B, a second mask pattern PR2 having box-shaped openings which expose portions of the pre-second and fourth step-shaped grooves PH2 and PH4 may be formed on the pre-stack PS which is formed with the first step-shaped groove H1 and the pre-second to fourth step-shaped grooves PH2 to PH4.

Successively, as the pre-stack PS is etched through a primary trench etching process using the second mask pattern PR2 as an etch mask, a first trench T1 and a pre-third trench T3 may be formed in the second and fourth contact regions CNR2 and CNR4, respectively. The depth of the first trench T1 and the pre-third trench T3 may correspond to K (K is a natural number of 2 or greater) times the vertical pitch P1 (see FIG. 15B) of the second material layers 26.

By the primary trench etching process, a second step-shaped groove H2 may be formed at the bottom of the first trench T1 as the pre-second step-shaped groove PH2 is transferred to lower first and second material layers, and a pre-fourth step-shaped groove PH4' may be formed by being recessed at the bottom of the pre-third trench PT3 as the pre-fourth step-shaped groove PH4 is transferred to lower first and second material layers. The second mask pattern PR2 may be formed by a photolithography process, and may be removed after the first trench T1 and the pre-third trench T3 are formed.

Figure 19A:
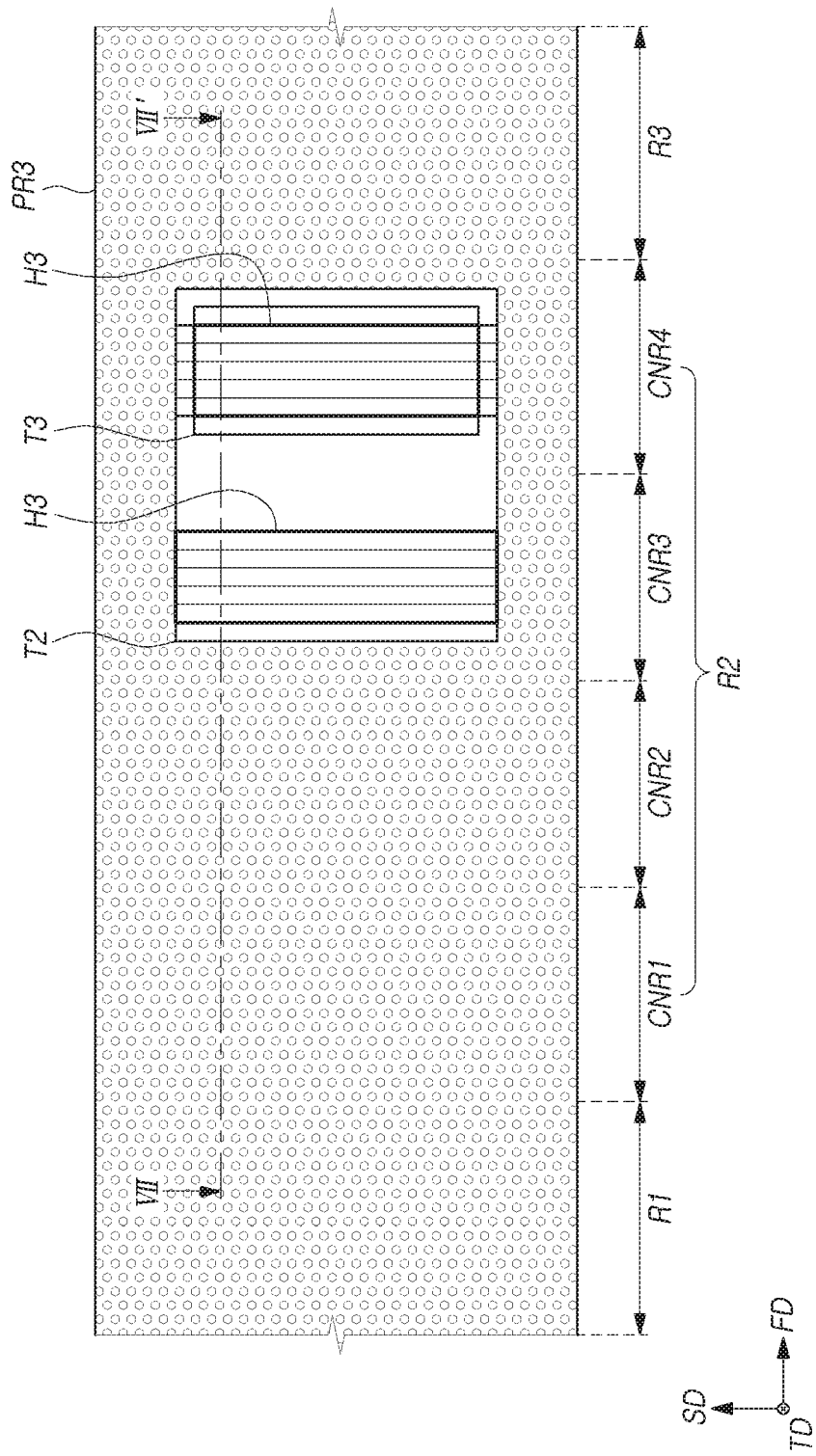
Figure 19B:
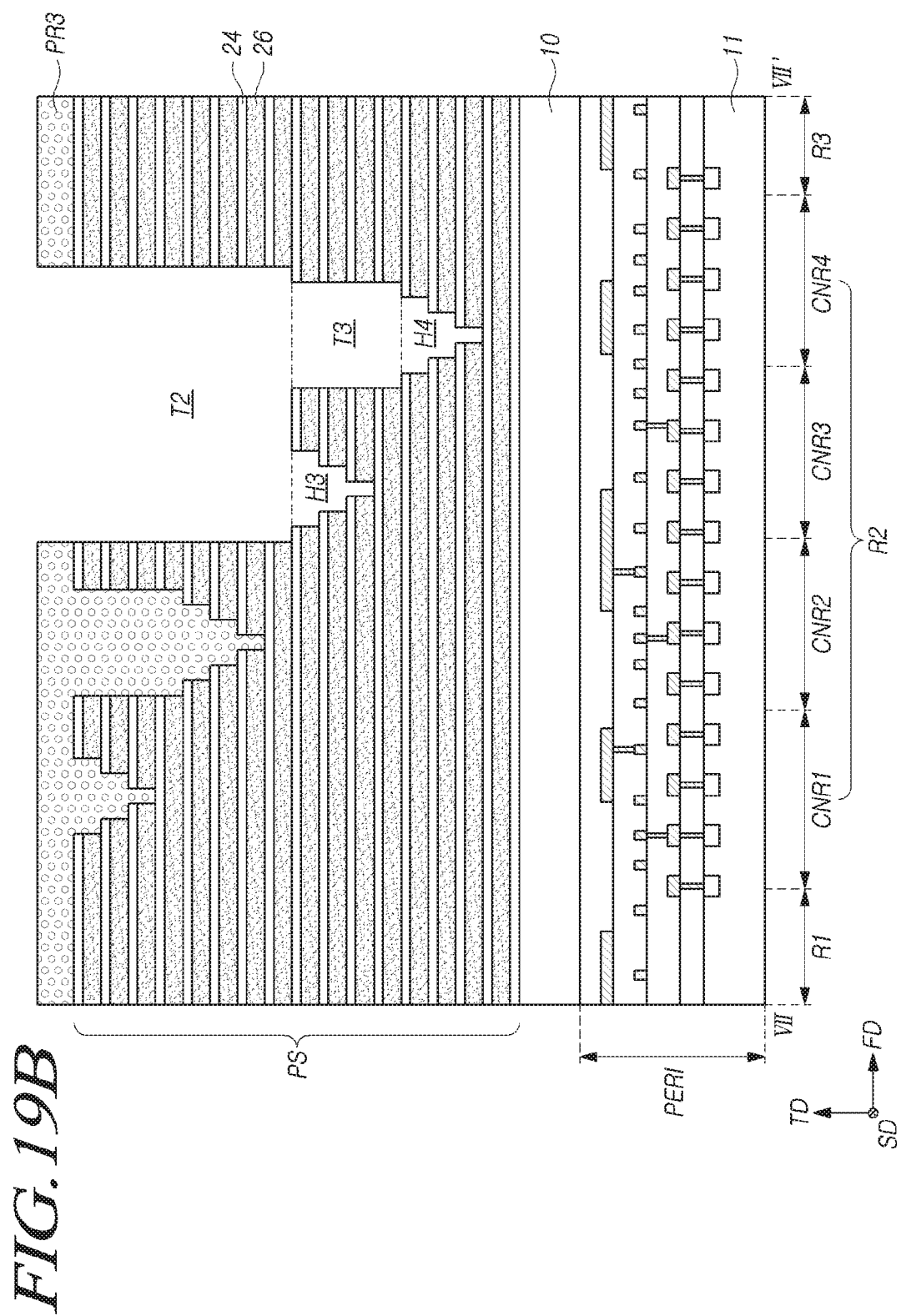

Referring to FIGS. 19A and 19B, a third mask pattern PR3 having a box-shaped opening which exposes the pre-third step-shaped groove PH3 (see FIG. 17B) and the pre-third trench PT3 (see FIG. 18B) may be formed on the pre-stack PS. While the embodiment illustrated in the drawing illustrates that the opening of the third mask pattern PR3 has a shape which simultaneously exposes the pre-third step-shaped groove PH3 and the pre-third trench PT3, it is to be noted that the embodiment is not limited thereto. The opening of the third mask pattern PR3 may have a shape which individually exposes the pre-third step-shaped groove PH3 and the pre-third trench PT3.

Then, as the pre-stack PS is etched through a secondary trench etching process using the third mask pattern PR3 as an etch mask, a second trench T2 may be formed in the third and fourth contact regions CNR3 and CNR4. The depth of the second trench T2 may correspond to M (M is a natural number of 2 or greater) times the vertical pitch P1 of the second material layers 26. The depth of the second trench T2 may be larger than the depth of the first trench T1.

By the secondary trench etching process, a third step-shaped groove H3 may be formed at the bottom of the second trench T2 as the pre-third step-shaped groove PH3 is transferred to lower first and second material layers, a third trench T3 may be formed at the bottom of the second trench T2 as the pre-third trench PT3 is transferred to lower first and second material layers, and a fourth step-shaped groove H4 may be formed by being recessed at the bottom of the third trench T3 as the pre-fourth step-shaped groove PH4' (see FIG. 18B) is transferred to lower first and second material layers. The third mask pattern PR3 may be formed by a photolithography process, and may be removed after forming the second trench T2.

Figure 20B:
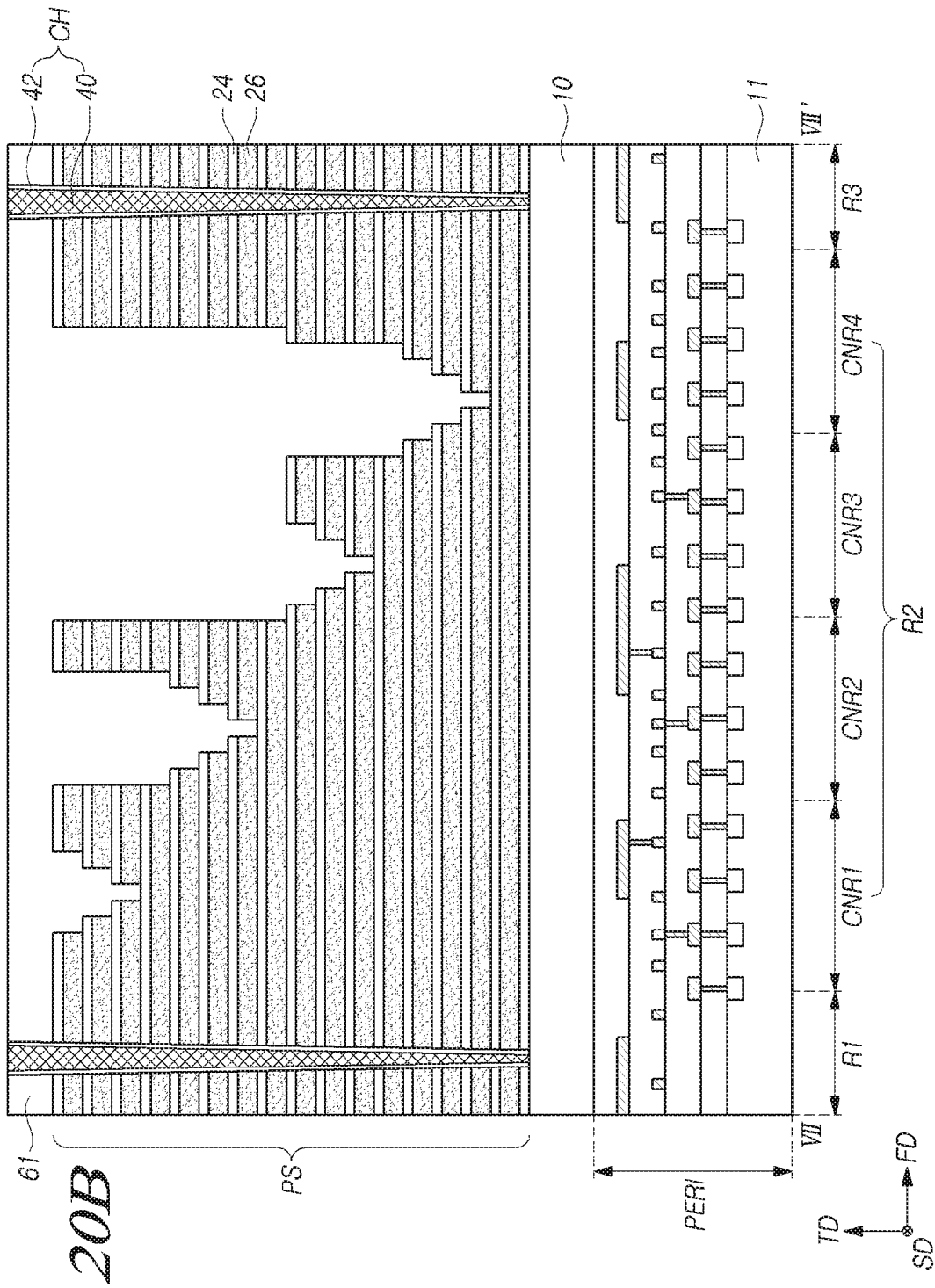

Referring to FIGS. 20A and 20B, a first top dielectric layer 61 which covers the pre-stack PS may be formed, and channel structures CH which vertically pass through the first top dielectric layer 61 and the pre-stack PS may be formed.

Figure 21A:
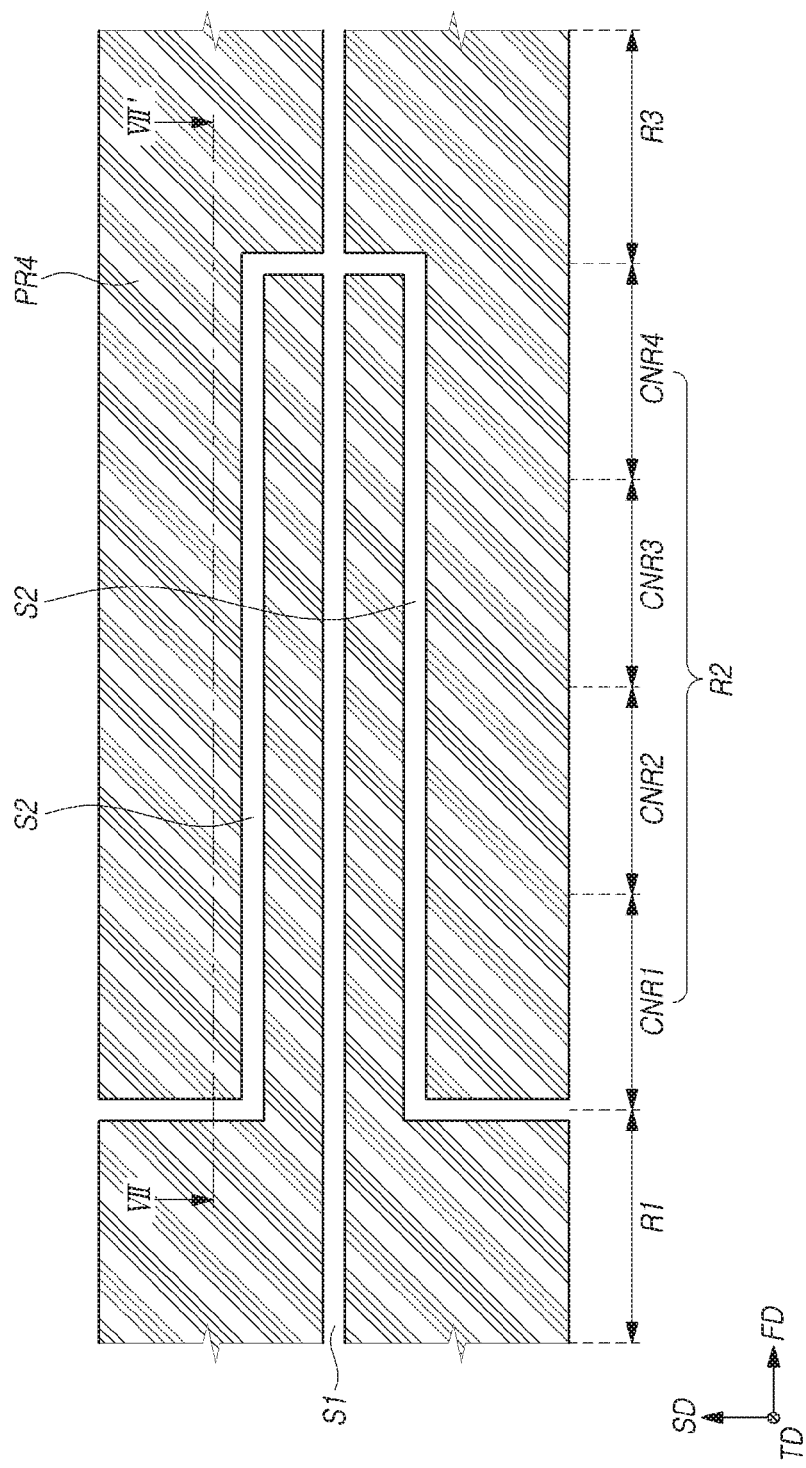

Referring to FIGS. 21A and 21B, a fourth mask pattern PR4 having an opening which exposes first and second slit forming parts may be formed on the first top dielectric layer 61. Then, as the pre-stack PS is etched by using the fourth mask pattern PR4 as an etch mask, a first slit S1 and a second slit S2 may be formed. The fourth mask pattern PR4 may be formed by a photolithography process, and may be removed after forming the first and second slits S1 and S2.

Thereafter, while not illustrated, as an etchant is injected through the first slit S1 and the second slit S2, the second material layers 26 which are used as sacrificial layers are removed, and, as a conductive material is filled in spaces which are formed due to the removal of the second material layers 26, electrodes (see the reference numeral 22 of FIG. 6) may be formed.

Figure 22:
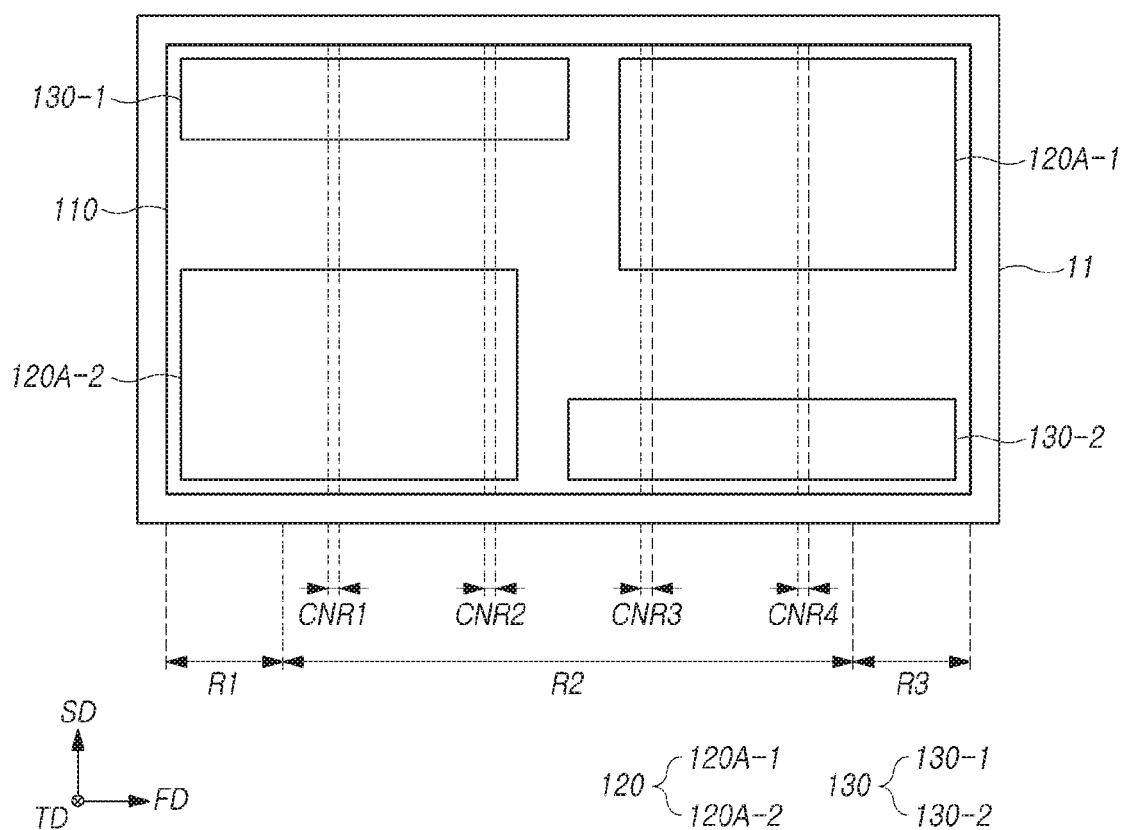
FIG. 22 is a top view schematically illustrating semiconductor memory device in accordance with an embodiment of the present invention.
Figure 23:
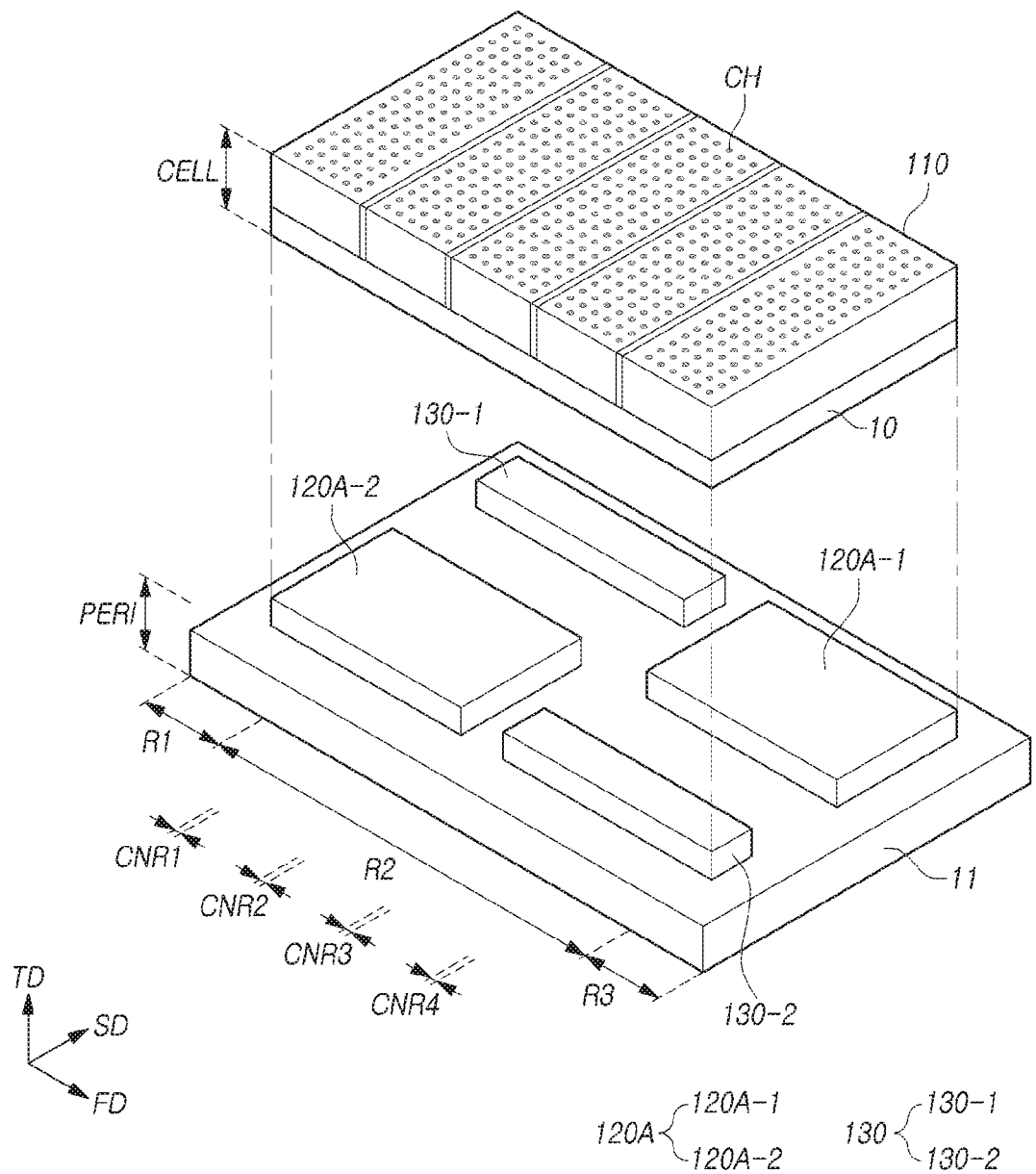
FIG. 23 is a perspective view of the semiconductor memory device illustrated in FIG. 22.
Figure 24:
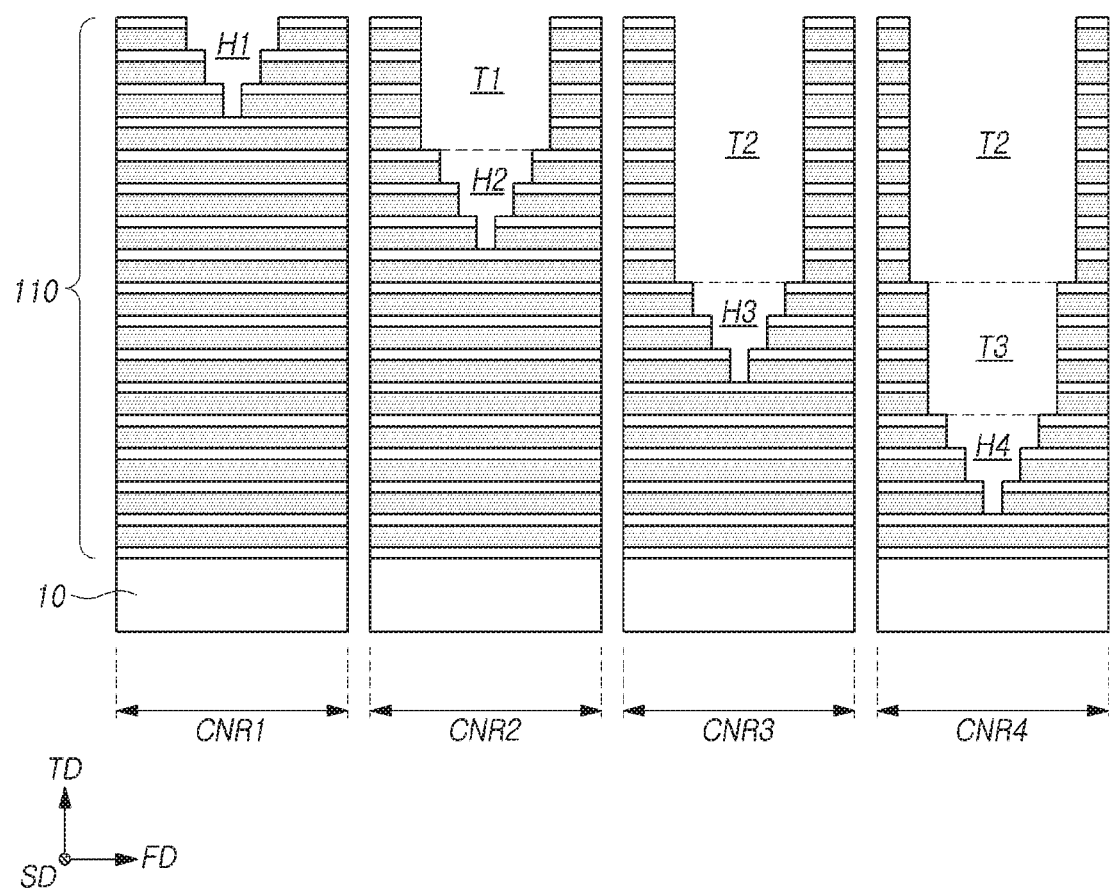
FIG. 24 is a cross-sectional view illustrating first to fourth contact regions of the semiconductor memory device illustrated in FIG. 22.

FIG. 22 is a top view schematically illustrating a semiconductor memory device in accordance with an embodiment, FIG. 23 is a perspective view schematically illustrating the semiconductor memory device illustrated in FIG. 22, and FIG. 24 is a cross-sectional view illustrating contact regions of the semiconductor memory device illustrated in FIG. 22.

Referring to FIGS. 22 and 23, in order to increase an area overlapping with a memory cell array 110 in the third direction TD, each of a pass transistor circuit 120A and a page buffer circuit 130 may be divided into at least two parts, and thereby, may be disposed in the form of a windmill. In detail, the pass transistor circuit 120A may be divided into first and second pass transistor circuits 120A-1 and 120A-2, and the page buffer circuit 130 may be divided into first and second page buffer circuits 130-1 and 130-2. The sum of the length of the first pass transistor circuit 120A-1 in the second direction SD and the length of the second pass transistor circuit 120A-2 in the second direction SD may be substantially the same as the length of the memory cell array 110 in the second direction SD. The sum of the length of the first page buffer circuit 130-1 in the first direction FD and the length of the second page buffer circuit 130-2 in the first direction FD may be substantially the same as the length of the memory cell array 110 in the first direction FD. The first and second pass transistor circuits 120A-1 and 120A-2 and the first and second page buffer circuits 130-1 and 130-2 may be disposed like a windmill in such a way to completely overlap with the memory cell array 110 in the third direction TD.

First to fourth contact regions CNR1 to CNR4 may be disposed to be separated from one another by a preset interval in the first direction FD, and first to fourth step-shaped grooves H1 to H4 may be disposed in the first to fourth contact regions CNR1 to CNR4, respectively. Channel structures CH may be disposed in not only first and third regions R1 and R3 but also in the second region R2 excluding the first to fourth contact regions CNR1 to CNR4.

According to the present embodiment, since the pass transistor circuit 120A and the first to fourth step-shaped grooves H1 to H4 are not densely disposed in a specified section and are disposed by being distributed in the first direction FD, a space under the memory cell array 110 may be efficiently utilized.

Figure 25A:
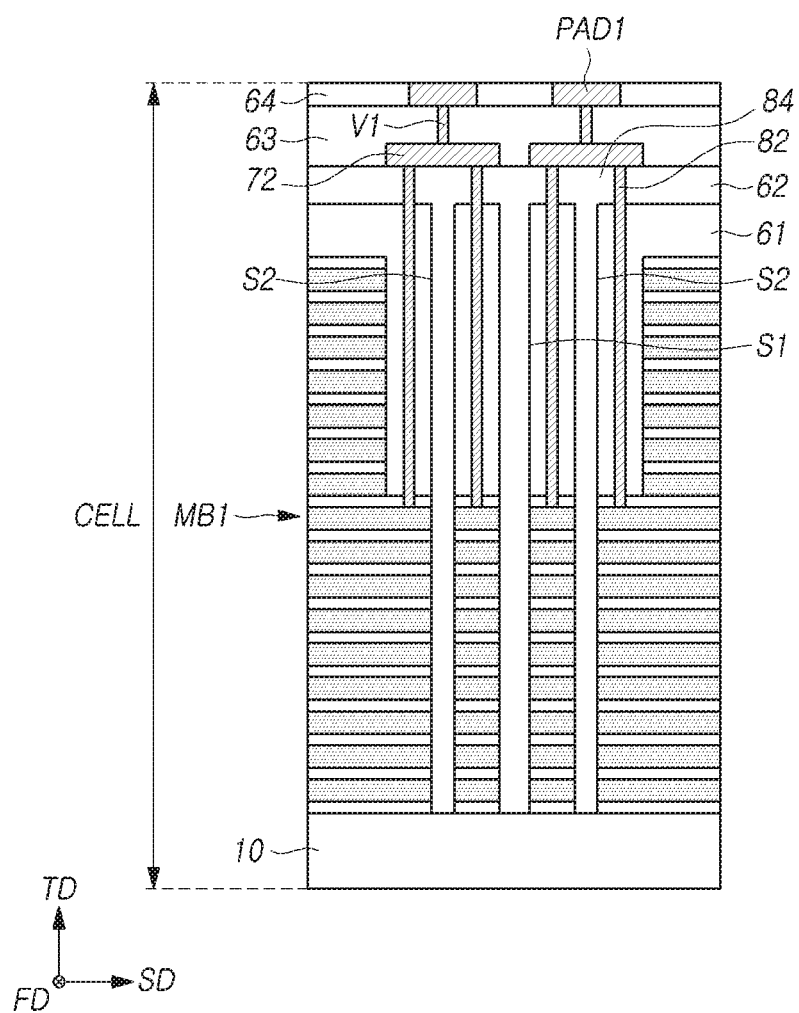
FIGS. 25A to 25C are cross-sectional views to assist in the explanation of a semiconductor memory device in accordance with an embodiment of the present invention.
Figure 25B:
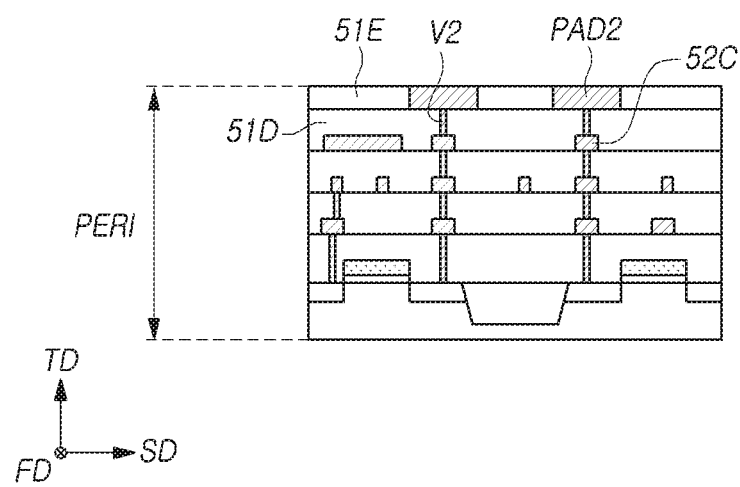
Figure 25C:
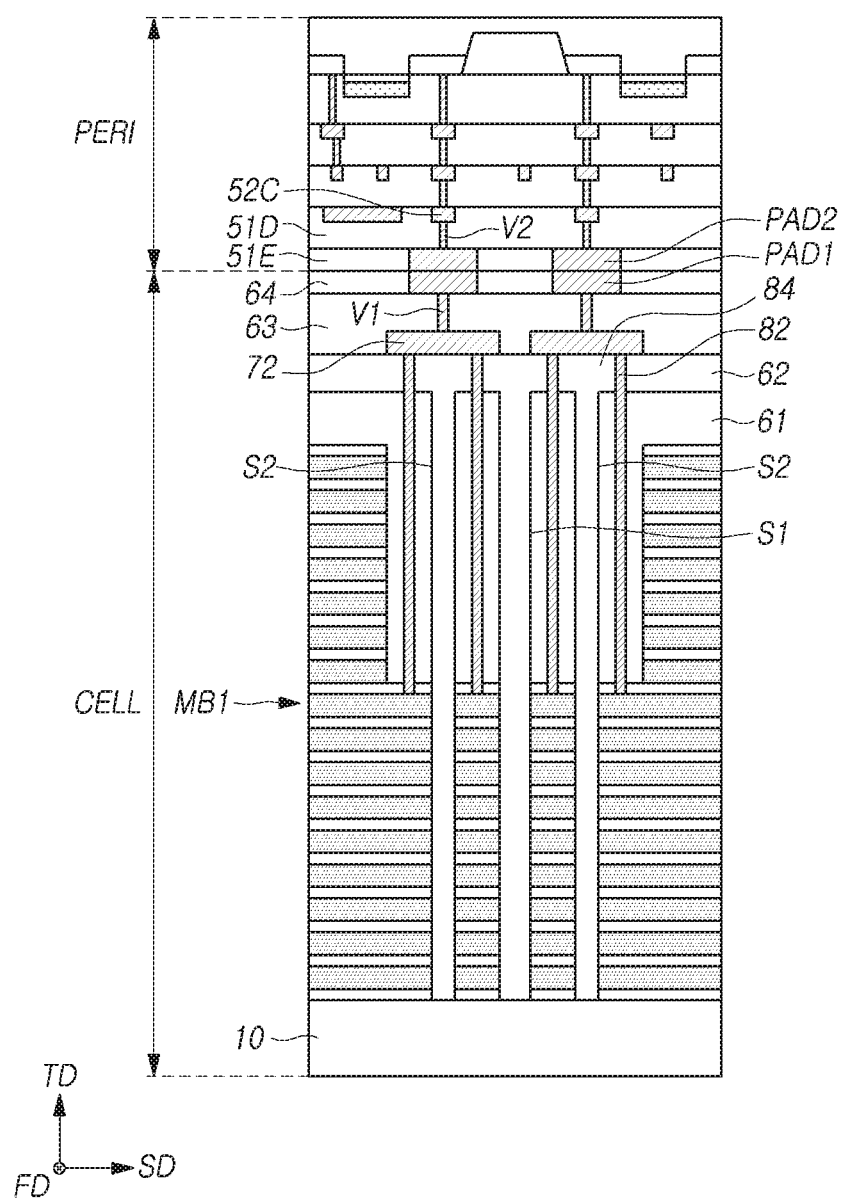

FIGS. 25A to 25C are representations of examples of cross-sectional views to assist in the explanation of a semiconductor memory device in accordance with an embodiment. In the present embodiment, detailed descriptions for the technical features overlapping with those described above with reference to FIGS. 3 to 24 will be omitted, and only differences will be described in detail.

Referring to FIG. 25A, a third top dielectric layer 63 may be defined on the second top dielectric layer 62, and thereby, may cover the second top wiring lines 72. While not illustrated, bit lines may be defined at the same layer as the second top wiring lines 72, and the third top dielectric layer 63 may cover the bit lines. First pads PAD1 which are coupled to the second top wiring lines 72 and the bit lines through first vias V1, respectively, may be defined on the third top dielectric layer 63. The first vias V1 may pass through the third top dielectric layer 63, and thereby, may couple the second top wiring lines 72 and the bit lines to the first pads PAD1 respectively corresponding thereto. A fourth top dielectric layer 64 may be formed on the third top dielectric layer 63, and thereby, may cover the side surfaces of the first pads PAD1 while exposing the top surfaces of the first pads PAD1.

Referring to FIG. 25B, second pads PAD2 which are coupled to the third bottom wiring lines 52C through second vias V2 may be defined on the fourth bottom dielectric layer 51D. The second vias V2 may pass through the fourth bottom dielectric layer 51D, and thereby, may couple the third bottom wiring lines 52C to the second pads PAD2 respectively corresponding thereto. A fifth bottom dielectric layer 51E may be defined on the fourth bottom dielectric layer 51D, and thereby, may cover the side surfaces of the second pads PAD2 while exposing the top surfaces of the second pads PAD2.

As the structure illustrated in FIG. 25B is turned upside down and is then stacked on the structure illustrated in FIG. 25A, a semiconductor device illustrated in FIG. 25C may be provided. As the second pads PAD2 of the structure illustrated in FIG. 25B are bonded to the first pads PAD1 of the structure illustrated in FIG. 25A, electrical paths may be formed. According to the present embodiment, the logic structure PERI may be disposed over the memory structure CELL. A semiconductor device of such a structure may be defined as a POC (peri over cell) structure.

Figure 26:
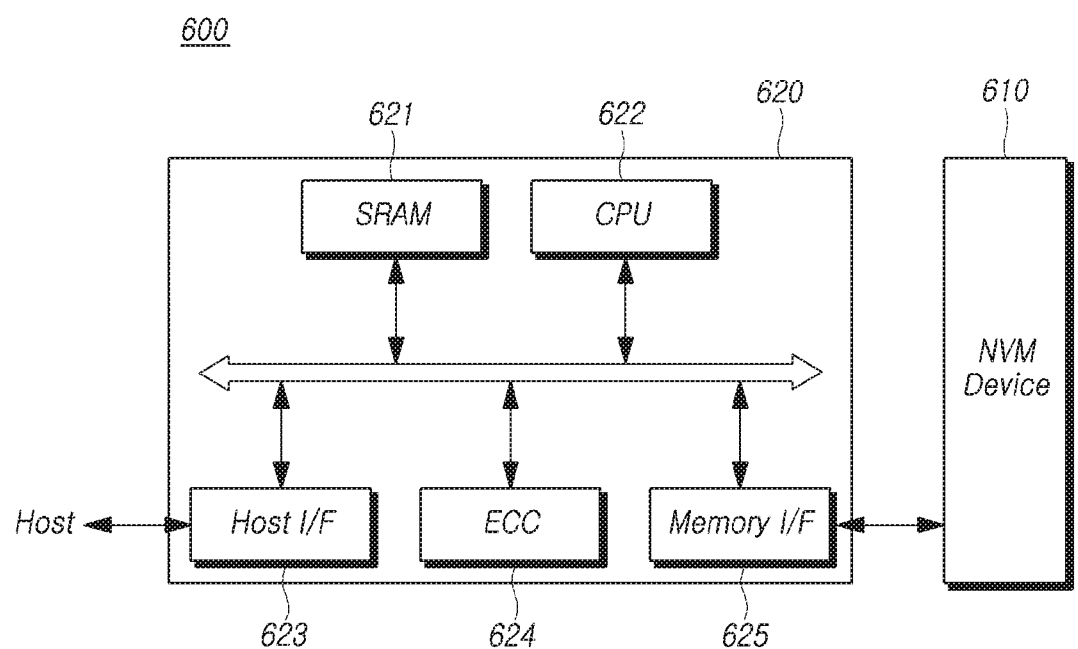
FIG. 26 is a block diagram schematically illustrating memory system including the semiconductor memory device in accordance with an embodiment of the present invention.

FIG. 26 is a simplified block diagram schematically illustrating a memory system including a semiconductor memory device according to an embodiment of the present invention.

Referring to FIG. 26, the memory system 600 may include the nonvolatile memory device 610 and a memory controller 620.

The nonvolatile memory device 610 may be comprised the nonvolatile memory device according to an embodiment of the invention as described above, and may be operated in the manner described above.

The memory controller 620 may control the nonvolatile memory device 610. For example, the combination of the nonvolatile memory device 610 and the memory controller 620, may be configured as a memory card or a solid state disk (SSD). The memory controller 620 may include an SRAM 621, a central processing unit (CPU) 622, a host interface 623, an ECC block 624, a memory interface 625 and a communication bus generally indicated by a double-headed arrow.

The SRAM 621 may be used as the working memory of the CPU 622. The host interface 623 may include the data exchange protocol of a host which may be coupled with the memory system 600.

The ECC block 624 may detect and correct an error included in the data read out from the nonvolatile memory device 610.

The memory interface 625 may interface with the nonvolatile memory device 610. The CPU 622 may perform general control operations for data exchange of the memory controller 620.

Although not shown, it should become apparent to a person skilled in the art that the memory system 600 may further be provided with a ROM which stores code data for interfacing with the host. The nonvolatile memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 27:
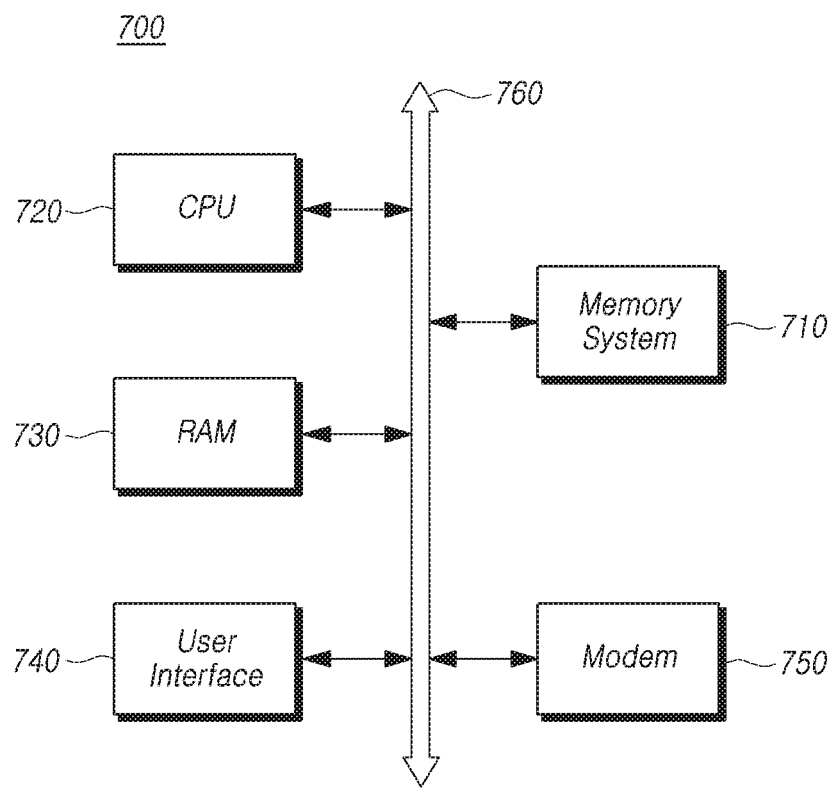
FIG. 27 is a block diagram schematically illustrating a computing system including a semiconductor memory device in accordance with an embodiment of the present invention.

FIG. 27 is a simplified block diagram schematically illustrating a computing system including a semiconductor memory device, according to an embodiment of the present invention.

Referring to FIG. 27, a computing system 700 according to an embodiment may include a memory system 710, a microprocessor (or CPU) 720, a RAM 730, a user interface 740, and a modem 750 such as a baseband chipset electrically coupled to a system bus 760.

In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS), a mobile DRAM, and so on. The memory system 710 may be configured, for example, as an SSD (solid state drive/disk) which uses a nonvolatile memory to store data. Also, as an example, the memory system 710 may be provided as a fusion flash memory (for example, a NAND or a NOR flash memory).

While various embodiments have been described above, it will be understood to those skilled in the art that the embodiments described are by way of example only. Accordingly, the semiconductor memory device described herein should not be limited based on the described embodiments.

What is claimed is:

1. A semiconductor memory device comprising:
   a first substrate including first, second, and third regions arranged adjacent sequentially adjacent to each other along a first direction;
   a memory block including a plurality of electrodes and interlayer dielectric layers alternately stacked over the first substrate;
   a slit dividing the memory block into a first electrode structure and a second electrode structure in the second region; and
   a plurality of step-shaped grooves formed to different depths in the memory block in the second region, the plurality of the step-shaped grooves being divided by the slit,
   wherein the first electrode structure and the second electrode structure are disposed adjacent to each other in a second direction intersecting with the first direction with the slit interposed therebetween.

2. The semiconductor memory device according to claim wherein each of the electrodes of the first electrode structure has a first pad region which is exposed by another electrode positioned thereon, in any one of the step-shaped grooves, each of the electrodes of the second electrode structure has a second pad region which is exposed by another electrode positioned thereon, in any one of the step-shaped grooves, and first pad regions of the first electrode structure and second pad regions of the second electrode structure which are positioned in the same step-shaped groove and are disposed at the same layers are disposed adjacent to each other in the second direction with the slit interposed therebetween.

3. The semiconductor memory device according to claim 1,
   wherein the first electrode structure is disposed in the first region and the second region, and the second electrode structure is disposed in the third region and the second region,
   wherein some electrodes which are positioned at upper positions among the electrodes of the second electrode structure are divided by any one of the step-shaped grooves, and remaining electrodes of the second electrode structure excluding the some electrodes are not divided by the step-shaped grooves.

4. The semiconductor memory device according to claim 1, further comprising:
   a trench disposed in the second region, and overlapping with at least one of the step-shaped grooves when viewed from the top,
   wherein the step-shaped groove overlapping with the trench has a shape which is vertically recessed into the memory block from a bottom surface of the trench.

5. The semiconductor memory device according to claim 4, wherein the trench extends in the second direction, passes through the first electrode structure, passes through a first side surface of the second electrode structure which faces the slit, and does not reach a second side surface of the second electrode structure which faces away from the first side surface, and wherein, among the step-shaped grooves, a step-shaped groove which does not overlap with the trench passes through the first and second electrode structures in the second direction in the second region.

6. The semiconductor memory device according to claim 2, further comprising:
first contact plugs respectively coupled to first pad regions of electrodes of the first electrode structure and second pad regions of electrodes of the second electrode structure; and
top wiring lines disposed over the memory block, and coupled in common to first pad regions and second pad regions which are disposed at the same layers, through the first contact plugs.

7. The semiconductor memory device according to claim 6, wherein the top wiring lines extend in the second direction and intersect with the slit.

8. The semiconductor memory device according to claim 6, wherein the top wiring lines are disposed within a width of the memory block in the second direction.

9. The semiconductor memory device according to claim 6, further comprising:
a second substrate disposed below the first substrate; and
a logic circuit disposed between the first substrate and the second substrate.

10. The semiconductor memory device according to claim 9, further comprising:
second contact plugs passing through the slit, and electrically coupling the top wiring lines and the logic circuit.

11. The semiconductor memory device according to claim 6, further comprising:
a second substrate disposed over the first substrate; and
a logic circuit disposed between the first substrate and the second substrate.

12. The semiconductor memory device according to claim 11, further comprising:
first pads disposed over a top dielectric layer which covers the top wiring lines, and respectively coupled to the top wiring lines through first vias which pass through the top dielectric layer; and
second pads disposed over a bottom dielectric layer which covers bottom wiring lines coupled to the logic circuit, and respectively coupled to the bottom wiring lines through second vias which pass through the bottom dielectric layer,
wherein the second pads are bonded to the first pads, respectively.

13. A semiconductor memory device comprising:
a first substrate defined with a first region, a second region which extends from the first region in a first direction, and a third region which extends from the second region in the first direction;
first and second memory blocks each including a plurality of electrodes and a plurality of interlayer dielectric layers which are alternately stacked over the first substrate, and disposed adjacent to each other in a second direction intersecting with the first direction with a first slit interposed therebetween;
a second slit dividing each of the first and second memory blocks into a first electrode structure and a second electrode structure; and
a plurality of step-shaped grooves formed to different depths in the first and second memory blocks in the second region, and divided by the first slit and the second slit, wherein, in the second region, the first electrode structure and the second electrode structure are disposed adjacent to each other in the second direction with the second slit interposed therebetween, wherein each of the electrodes of the first electrode structure has a first pad region which is exposed by another electrode positioned thereon, in any one of the step-shaped grooves, and each of the electrodes of the second electrode structure has a second pad region which is exposed by another electrode positioned thereon, in any one of the step-shaped grooves, and wherein first pad regions of the first electrode structure and second pad regions of the second electrode structure which are positioned in the same step-shaped groove and are disposed at the same layers are disposed adjacent to each other in the second direction with the second slit interposed therebetween.

14. The semiconductor memory device according to claim 13, wherein the first electrode structure is disposed in the first region and the second region, and the second electrode structure is disposed in the third region and the second region, and wherein some electrodes which are positioned at upper positions among the electrodes of the second electrode structure are divided by any one of the step-shaped grooves, and remaining electrodes of the second electrode structure excluding the some electrodes are not divided by the step-shaped grooves.

15. The semiconductor memory device according to claim 13, further comprising:
first contact plugs respectively coupled to first pad regions of electrodes of the first electrode structure and second pad regions of electrodes of the second electrode structure; and
a plurality of top wiring lines provided over the first and second memory blocks, and coupled in common to first pad regions and second pad regions which are positioned in the same step-shaped grooves and are disposed at the same layers, through the first contact plugs.

16. The semiconductor memory device according to claim 15, wherein the top wiring lines which are electrically coupled to the electrodes of the first memory block are disposed within a width of the first memory block in the second direction, and the top wiring lines which are electrically coupled to the electrodes of the second memory block are disposed within a width of the second memory block in the second direction.

17. The semiconductor memory device according to claim 15, further comprising:
a second substrate disposed below the first substrate;
a logic circuit disposed between the first substrate and the second substrate; and
second contact plugs passing through the second slit, and electrically coupling the top wiring lines and the logic circuit.

18. The semiconductor memory device according to claim 15, further comprising:
a second substrate disposed over the first substrate;
a logic circuit disposed between the first substrate and the second substrate;

first pads disposed over a top dielectric layer which covers the top wiring lines, and respectively coupled to the top wiring lines through first vias which pass through the top dielectric layer; and second pads disposed over a bottom dielectric layer which covers bottom wiring lines coupled to the logic circuit, and respectively coupled to the bottom wiring lines through second vias which pass through the bottom dielectric layer, wherein the second pads are bonded to the first pads, respectively.

19. A semiconductor memory device comprising:

a first substrate including at least one contact region disposed between a first region, and a third region arranged in a first direction;

first and second electrode structures disposed over the first substrate adjacent to each other in a second direction intersecting with the first direction with a slit separating the first and second electrode structures, wherein the first and third regions are memory cell regions including a plurality of memory cells, and wherein the at least one contact region includes a plurality of step-shaped grooves formed to different depths and divided by the slit.

20. The semiconductor memory device according to claim 19, further comprising:

a plurality of top wiring lines, each extending in the second direction to couple an electrode of the first electrode structure with an electrode of the second electrode structure, and a plurality of vertical contact plugs, each passing through the slit to couple a top wiring line with a pass transistor of a peripheral circuit.

* * * * *